United States Patent
Tatsumi

(10) Patent No.: US 11,869,867 B2
(45) Date of Patent: Jan. 9, 2024

(54) SEMICONDUCTOR DEVICE

(71) Applicant: SUMITOMO ELECTRIC INDUSTRIES, LTD., Osaka (JP)

(72) Inventor: Taizo Tatsumi, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 384 days.

(21) Appl. No.: 17/443,987

(22) Filed: Jul. 29, 2021

(65) Prior Publication Data

US 2022/0059495 A1 Feb. 24, 2022

(30) Foreign Application Priority Data

Aug. 24, 2020 (JP) .................. 2020-141162

(51) Int. Cl.
*H01L 23/00* (2006.01)
*H01L 23/66* (2006.01)
*H01L 23/495* (2006.01)
*H01L 23/31* (2006.01)

(52) U.S. Cl.
CPC .......... *H01L 24/48* (2013.01); *H01L 23/3107* (2013.01); *H01L 23/49503* (2013.01); *H01L 23/49534* (2013.01); *H01L 23/49541* (2013.01); *H01L 23/66* (2013.01); *H01L 2223/6611* (2013.01); *H01L 2223/6644* (2013.01); *H01L 2224/48245* (2013.01); *H01L 2924/182* (2013.01)

(58) Field of Classification Search
CPC ................. H01L 24/48; H01L 23/3107; H01L 23/49503; H01L 23/49534; H01L 23/49541; H01L 23/66
See application file for complete search history.

(56) References Cited

U.S. PATENT DOCUMENTS

| | | | | |
|---|---|---|---|---|
| 2005/0121752 A1* | 6/2005 | Lee | .......................... | H01L 24/49 257/666 |
| 2008/0246165 A1* | 10/2008 | Hess | ....................... | H01L 24/40 257/E23.079 |
| 2010/0123226 A1* | 5/2010 | Chen | ....................... | H01L 24/49 257/670 |

FOREIGN PATENT DOCUMENTS

JP 2010-166100 7/2010

* cited by examiner

*Primary Examiner* — Marc Anthony Armand
(74) *Attorney, Agent, or Firm* — IPUSA, PLLC

(57) ABSTRACT

A semiconductor device includes: a single die pad made of a metal or metal alloy and having a first surface, a second surface that is an opposite side of the first surface, and a pair of ground leads protruding from an end edge in plan view; a signal lead arranged between the ground leads; a plurality of leads arranged around the die pad in plan view; a semiconductor chip mounted on the second surface; bonding wires connecting a signal pad of the chip and the signal lead and connecting a ground pad of the chip and the ground leads; and a mold resin covering the die pad, the signal lead, the plurality of leads, the chip, and the bonding wires; wherein an interval between the signal lead and each of the ground leads is narrower than an interval between the plurality of leads.

14 Claims, 10 Drawing Sheets

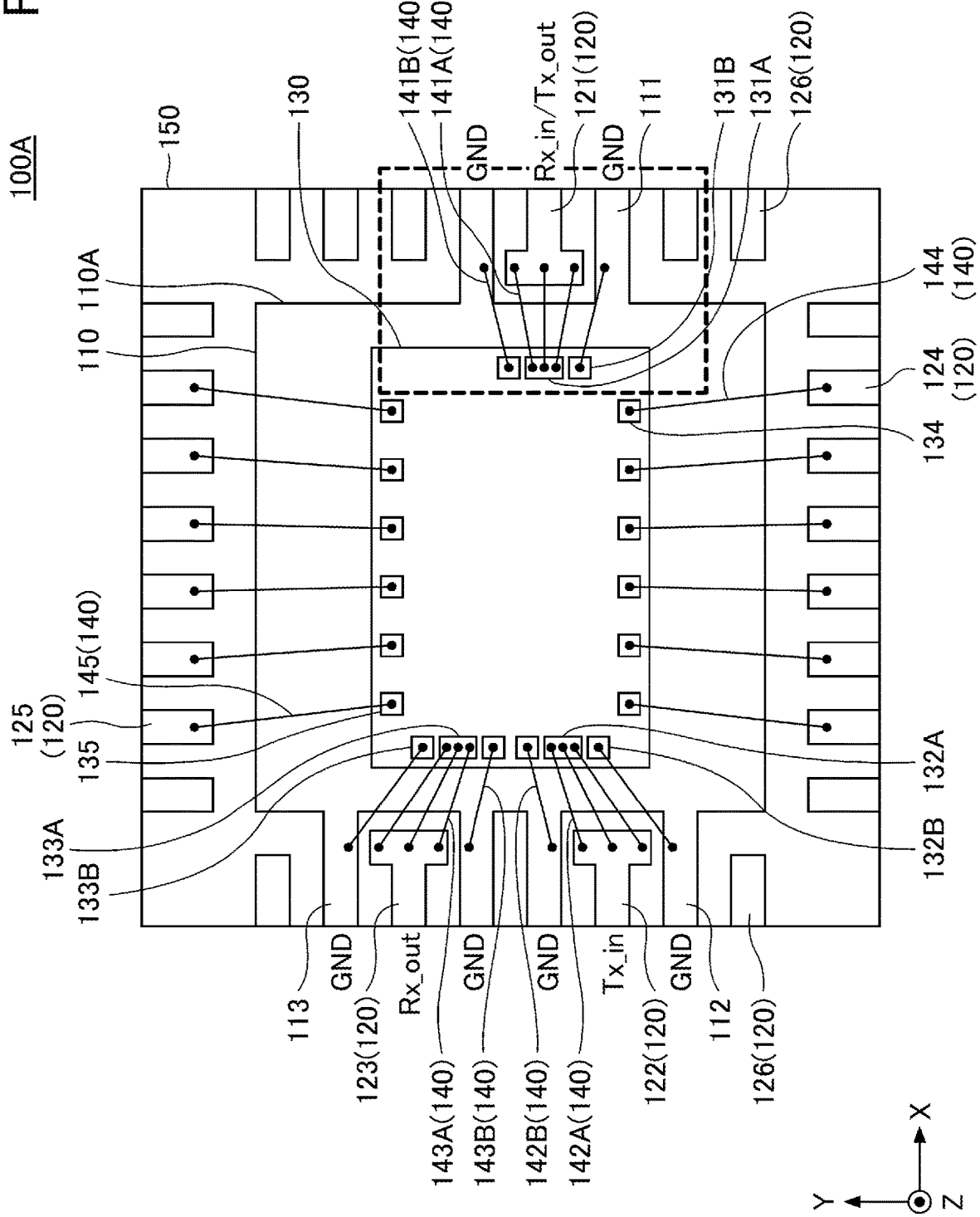

SEMICONDUCTOR DEVICE

CROSS-REFERENCE TO RELATED APPLICATION

The present application is based upon and claims priority to Japanese Patent Application No. 2020-141162, filed on Aug. 24, 2020, the entire contents of which are incorporated herein by reference.

BACKGROUND OF THE INVENTION

1. Field of the Invention

The present disclosure relates to a semiconductor device.

2. Description of the Related Art

Conventionally, there is a resin sealed semiconductor device including a die pad, a signal lead, a ground lead connected to the die pad, a semiconductor chip having a ground electrode pad, a metal fine wire (bonding wire), and a sealing resin that seals the die pad and the semiconductor chip and exposes a lower portion of the signal lead and the ground lead as an external terminal. The ground lead is connected to the ground electrode pad. As an example of a resin sealed semiconductor device, there is a QFN (Quad Flat Non-leaded Package) type semiconductor device in which a lower portion of a signal lead exposed from a package also serves as an external terminal (see, for example, Patent Document 1).

PRIOR ART DOCUMENT

Patent Document

[Patent Document 1] Japanese Laid-open Patent

However, in a resin sealed semiconductor device as described above, in order to improve the operation characteristics of a circuit contained in the semiconductor chip, it is desirable to improve the impedance characteristics of bonding wires connected to a signal lead.

However, because the resin sealed semiconductor device has a structure simplified for cost reduction, there are structural constraints in improving the impedance characteristics of the bonding wires connected to the signal lead.

Hence, an object of the present invention is to provide a resin sealed semiconductor device with improved impedance characteristics.

SUMMARY OF THE INVENTION

According to the present disclosure, a semiconductor device includes: a single die pad having a first surface, a second surface that is an opposite side of the first surface, and a pair of ground leads protruding from an end edge in plan view, the die pad being made of a metal or a metal alloy; a signal lead that is arranged between the pair of ground leads; a plurality of leads that are arranged around the die pad in plan view; a semiconductor chip that is mounted on the second surface; a plurality of bonding wires connecting a signal pad of the semiconductor chip and the signal lead and connecting a ground pad of the semiconductor chip and the pair of ground leads; and a mold resin covering the die pad, the signal lead, the plurality of leads, the semiconductor chip, and the plurality of bonding wires; wherein an interval between the signal lead and each of the pair of ground leads is narrower than an interval between the plurality of leads.

It is possible to provide a resin sealed semiconductor device with improved impedance characteristics.

BRIEF DESCRIPTION OF THE DRAWINGS

FIG. 12 is a diagram illustrating a semiconductor device 100A according to a modified example of the embodiment.

DESCRIPTION OF THE EMBODIMENTS

Figure 1:
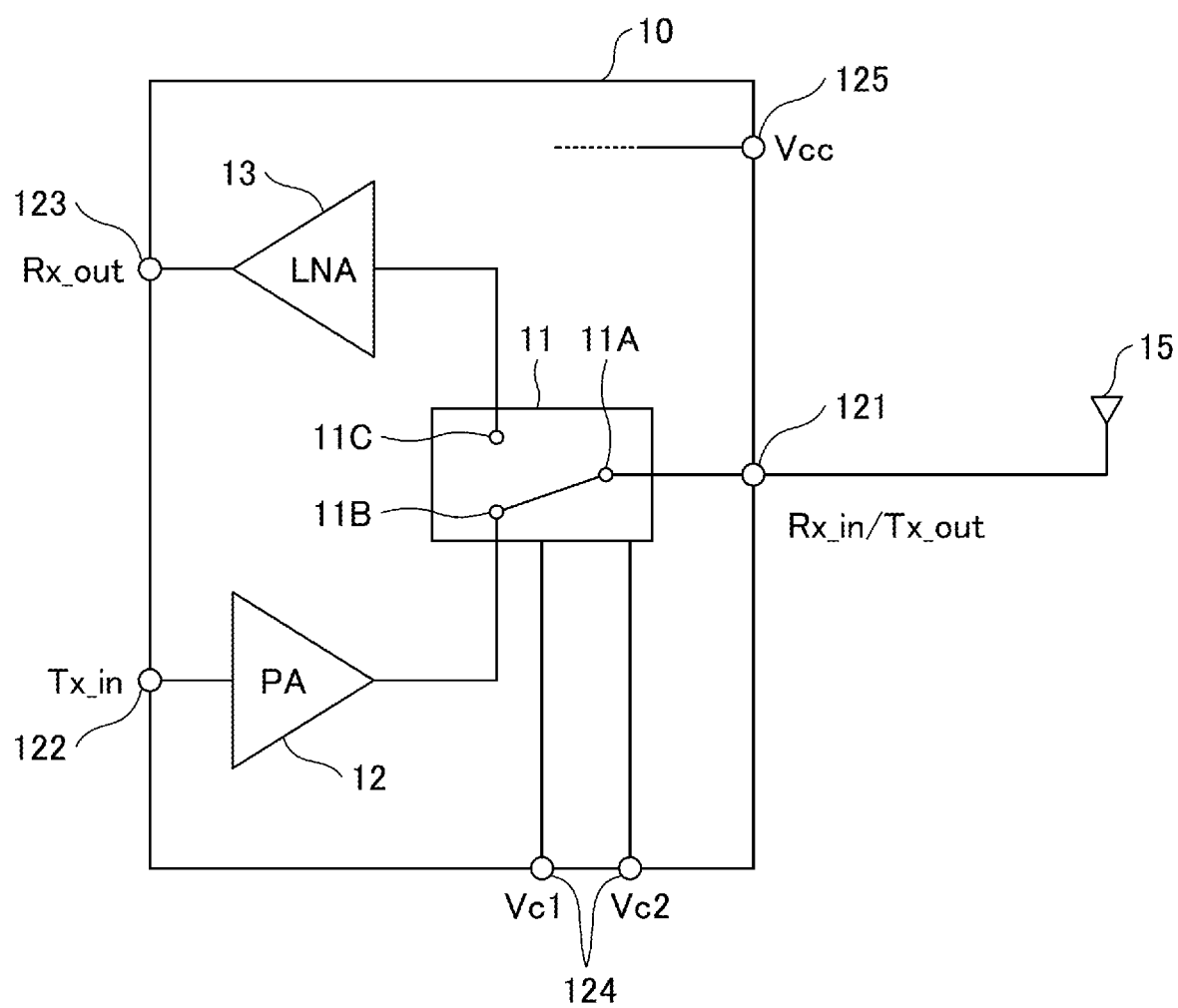
FIG. 1 is a diagram illustrating an example of a configuration of a RF front end circuit 10.

An embodiment will be described in the following.

Description of Embodiment of the Present Disclosure

<1> According to one aspect of the present disclosure, a semiconductor device includes: a single die pad having a first surface, a second surface that is an opposite side of the first surface, and a pair of ground leads protruding from an end edge in plan view, the die pad being made of a metal or a metal alloy; a signal lead that is arranged between the pair of ground leads; a plurality of leads that are arranged around the die pad in plan view; a semiconductor chip that is mounted on the second surface; a plurality of bonding wires connecting a signal pad of the semiconductor chip and the signal lead and connecting a ground pad of the semiconductor chip and the pair of ground leads; and a mold resin covering the die pad, the signal lead, the plurality of leads, the semiconductor chip, and the plurality of bonding wires; wherein an interval between the signal lead and each of the pair of ground leads is narrower than an interval between the plurality of leads.

The semiconductor device according to one aspect of the present disclosure is a resin sealed semiconductor device. When the interval between the signal lead and each of the pair of ground leads is narrower than the interval between the plurality of leads, the capacitance between the signal lead and each of the pair of ground leads is increased, and by reducing the inductance of the bonding wires connected to the signal lead, the impedance characteristics of the bonding wires connected to the signal lead are improved. Accordingly, a resin sealed semiconductor device with improved impedance characteristics can be provided.

<2> In the semiconductor device of <1>, an interval between the signal lead and the die pad may be narrower than an interval between the plurality of leads and the die pad. When the interval between the signal lead and the die pad is narrow, the capacitance between the signal lead and the die pad is increased, and by reducing the inductance of the bonding wires connected to the signal lead, the impedance characteristics of the bonding wires connected to the signal lead are further improved. Accordingly, a resin sealed semiconductor device with further improved impedance characteristics can be provided.

<3> According to another one aspect of the present disclosure, a semiconductor device includes: a single die pad having a first surface and a second surface that is an opposite side of the first surface, the die pad being made of a metal or a metal alloy; a signal lead that is arranged next to the die pad in plan view; a plurality of leads that are arranged around the die pad in plan view; a semiconductor chip that is mounted on the second surface; a plurality of bonding wires connecting a signal pad of the semiconductor chip and the signal lead and connecting the semiconductor chip and at least one of the plurality of leads; and a mold resin covering the die pad, the signal lead, the plurality of leads, the semiconductor chip, and the plurality of bonding wires; wherein an interval between the signal lead and the die pad is narrower than an interval between the plurality of leads and the die pad.

The semiconductor device according to one aspect of the present disclosure is a resin sealed semiconductor device. When the interval between the signal lead and the die pad is narrow, the capacitance between the signal lead and the die pad is increased, and by reducing the inductance of the bonding wires connected to the signal lead, the impedance characteristics of the bonding wires connected to the signal lead are improved. Accordingly, a resin sealed semiconductor device with improved impedance characteristics can be provided.

<4> In the semiconductor device of <3>, the die pad may further include a pair of ground leads protruding from an end edge in plan view, the plurality of bonding wires may further connect a ground pad of the semiconductor chip and the pair of ground leads, and an interval between the signal lead and each of the pair of ground leads may be narrower than an interval between the plurality of leads. When the interval between the signal lead and each of the pair of ground leads is narrower than the interval between the plurality of leads, the capacitance between the signal lead and each of the pair of ground leads is increased, and by reducing the inductance of the bonding wires connected to the signal lead, the impedance characteristics of the bonding wires connected to the signal lead are further improved. Accordingly, a resin sealed semiconductor device with further improved impedance characteristics can be provided.

<5> In the semiconductor device of any one of <1>, <2>, and <4>, the signal lead may include a first lead portion on a far side from the semiconductor chip in plan view; and a second lead portion located on a closer side to the semiconductor chip than the first lead portion is in plan view and having a width wider than a width of the first lead portion in a direction of connecting the pair of ground leads, and an interval between the second lead portion and each of the pair of ground leads may be narrower than the interval between the plurality of leads. When the second lead portion of the signal lead on the closer side to the semiconductor chip has a wider width than the first lead portion on the farther side with respect to the semiconductor chip, the capacitance between the signal lead and each of the pair of ground leads can be increased, and the capacitance between the signal lead and the die pad can be increased. By such a simple configuration, it is possible to reduce the inductance of the bonding wires connected to the signal lead and improve the impedance characteristics of the bonding wires connected to the signal lead. Accordingly, a resin sealed semiconductor device with a simple configuration and with improved impedance characteristics can be provided.

<6> In the semiconductor device of <5>, an interval between the first lead portion and each of the pair of ground leads may be equal to the interval between the plurality of leads. When the interval between the first lead portion and each of the pair of ground leads is equal to the interval between the plurality of leads, changes from a semiconductor device not having the signal lead portion and the pair of ground leads can be minimized and the configuration is very simple. Accordingly, a resin sealed semiconductor device with a very simple configuration and with improved impedance characteristics can be provided.

<7> In the semiconductor device of <5> or <6>, both ends of the second lead portion in the width direction may be located outside both ends of the first lead portion in the width direction. When both ends of the second lead portion in the width direction are located outside both ends of the first lead portion in the width direction, the second lead portion and the pair of ground leads located on both sides of the second lead portion in the width direction can be arranged in a balanced manner, the capacitance between the signal lead and each of the pair of ground leads can be efficiently increased, and the capacitance between the signal lead and the die pad can be efficiently increased. As a result, the inductance of the bonding wires connected to the signal lead can be reduced efficiently and the impedance characteristics of the bonding wires connected to the signal lead can be improved efficiently. Accordingly, a resin sealed semiconductor device with efficiently improved impedance characteristics can be provided.

<8> In the semiconductor device of any one of <5> to <7>, the first lead portion and the second lead portion may have a line-symmetric shape with respect to an axis of symmetry extending in a direction perpendicular to the end edge in plan view. When the first lead portion and the second lead portion are line-symmetric, it is possible to obtain a configuration that enables to easily adjust the capacitance between the signal lead and each of the pair of ground leads and the capacitance between the signal lead and the die pad. As a result, the line-symmetric shape can be used to efficiently reduce the inductance of the bonding wires connected to the signal lead, and the line-symmetric shape can be used to efficiently improve the impedance characteristics of the bonding wires connected to the signal lead. Accordingly, a resin sealed semiconductor device with efficiently improved impedance characteristics using a line-symmetric shape can be provided.

<9> In the semiconductor device of any one of <5> to <8>, the first lead portion and the second lead portion may be T-shaped. When the first lead portion and the second lead portion are T-shaped, it is possible to obtain a configuration that is easily manufactured and that enables to easily adjust the capacitance between the signal lead and each of the pair of ground leads and the capacitance between the signal lead and the die pad. As a result, the inductance of the signal bonding wires connected to the signal lead, which enables to easily adjust the capacitance and which is easily manufactured, can be efficiently reduced, and the impedance characteristics of the signal bonding wires connected to the signal lead, which enables to easily adjust the capacitance and which is easily manufactured, can be efficiently improved. Accordingly, a resin sealed semiconductor device that enables to easily adjust the capacitance, that is easily manufactured, and that has efficiently improved impedance characteristics can be provided.

<10> In the semiconductor device of any one of <5> to <9>, a pair of signal bonding wires of the plurality of bonding wires connecting the second lead portion of the signal lead and the signal pad may be connected to respective portions of the second lead portion located on both sides in the width direction and outside the first lead portion. When a pair of signal bonding wires connecting the second lead portion of the signal lead and the signal pad are connected to respective portions of the second lead portion located on both sides in the width direction and outside the first lead portion, because the pair of signal bonding wires can be brought closer to the pair of ground leads, the inductance of the pair of signal bonding wires can be effectively reduced, and the impedance characteristics of the pair of signal bonding wires can be effectively improved. Accordingly, a resin sealed semiconductor device with effectively improved impedance of the pair of signal bonding wires can be provided.

<11> In the semiconductor device of <10>, an interval between second end portions at which the pair of signal bonding wires are connected to the second lead portion is wider than an interval between first end portions at which the pair of signal bonding wires are connected to the signal pad. Because the pair of signal bonding wires can be reliably brought closer to the pair of ground leads, the inductance of the pair of signal bonding wires can be more reliably reduced and the impedance characteristics of the pair of signal bonding wires can be improved more reliably. Accordingly, a resin sealed semiconductor device with further reliably improved impedance of the pair of signal bonding wires can be provided.

<12> In the semiconductor device of <10> or <11>, a pair of ground bonding wires of the plurality of bonding wires connecting the pair of ground leads and the ground pad extend along the pair of signal bonding wires. Using the capacitance by the coupling of the pair of ground bonding wires and the pair of signal bonding wires, the inductance of the pair of signal bonding wires can be more effectively reduced and the impedance characteristics of the pair of signal bonding wires can be more effectively improved. Accordingly, a resin sealed semiconductor device with further effectively improved impedance of the pair of signal bonding wires can be provided.

<13> In the semiconductor device of any one of <5> to <12>, the signal lead may include a first portion that is located on the first surface side and a second portion that is in continuous with the first portion and that is located on the second surface side, the first lead portion may extend at the first portion and the second portion, and the second lead portion may extend only at the second portion. For the first lead portion of the signal lead, changes from a semiconductor device without the second lead portion and the pair of ground leads can be minimized and the second lead portion can be realized only with the second portion, and therefore the configuration is very simple. Accordingly, a resin sealed semiconductor device with a very simple configuration and with improved impedance characteristics can be provided.

<14> In the semiconductor device of any one of <1> to <13>, the mold resin may expose at least a portion of the first surface and at least a portion of the signal lead on the first surface side. Therefore, the surface of the first lead portion on the first surface side can be used as an external terminal, and a QFN type semiconductor device with improved impedance characteristics can be provided.

Details of Embodiment of the Present Disclosure

In the following, an embodiment of the present disclosure will be described in detail. However, the present disclosure is not limited to the following embodiment. It should be noted that in the specification and the drawings of the present application, the same reference numerals may be assigned to components having substantially the same function/configuration so that repetitive descriptions may be omitted.

Embodiment

[Configuration of RF (Radio Frequency) Front End Circuit 10]

FIG. 1 is a diagram illustrating an example of a configuration of a RF front end circuit 10. The RF front end circuit 10 may be implemented by a packaged semiconductor device and may be used in a base station for wireless communication, for example. It should be noted that although a configuration in which a circuit implemented by a semiconductor device is the RF front end circuit 10 will be described here, the present disclosure is not limited to such a RF front end circuit.

The RF front end circuit 10 includes a switch circuit 11, a PA (Power Amplifier) 12, a LNA (Low Noise Amplifier) 13, signal leads 121, 122, and 123, and power leads 124 and 125. The switch circuit 11 is a three-terminal type switch having terminals 11A, 11B, and 11C. The signal lead 121 is connected to the terminal 11A, an output terminal of the PA 12 is connected to the terminal 11B, and an input terminal of the LNA 13 is connected to the terminal 11C. The switch circuit 11 receives power supply at voltages Vc1 and Vc2 from the two power leads 124. Also, the RF front end circuit 10 receives power supply at voltage Vcc from the power lead 125.

The signal lead 121 is connected to an antenna 15. The signal lead 121 outputs a transmission (Tx) signal to the antenna 15 and receives an reception (Rx) signal input from the antenna 15. Thus, Rx_in/Tx_out is marked for the signal lead 121. The signal lead 122 is connected to the input terminal of the PA 12 and receives a transmission (Tx) signal input from a transmission circuit external to the RF front end circuit 10. Thus, Tx_in is marked for the signal lead 122. The signal lead 123 is connected to the output terminal of the LNA 13 and outputs a reception (Rx) signal to a reception circuit external to the RF front end circuit 10. Thus, Rx_out is marked for the signal lead 123.

In such a RF front end circuit 10, the switch circuit 11 switches the connection destination of the terminal 11A to either the terminal 11B or the terminal 11C. The PA 12 amplifies the transmission (Tx) signal and outputs the signal to the terminal 11B of the switch circuit 11, and the amplified transmission (Tx) signal is emitted from the antenna 15. The LNA 13 performs noise removal and amplification on the reception (Rx) signal that is received by the antenna 15 and that is input via the terminals 11A and 11C of the switch circuit 11 and outputs it to the signal lead 123. For example, the frequencies of the transmission (Tx) signal and the reception (Rx) signal may be from the 20 GHz band to the 40 GHz band, and may be in a millimeter wave band.

Here, the terminal 11A of the switch circuit 11 and the signal lead 121, the input terminal of the PA 12 and the signal lead 122, and the output terminal of the LNA 13 and the signal lead 123 are connected by respective bonding wires (signal bonding wires). The characteristic impedance of the terminals 11A, 11B, and 11C and the characteristic impedance of the signal leads 121, 122, and 123 are relatively easily set to be 50Ω or a value close to 50Ω, but the characteristic impedance of the signal bonding wires is a value greater than 50Ω.

As the signal transmission loss in the signal bonding wire between the terminal 11A of the switch circuit 11 and the signal lead 121 increases, the transmission loss of the signal (fundamental signal) amplified by the PA 12 and the NF (Noise Figure) value of the LNA 13 increase. Also, as the signal transmission loss in the signal bonding wire between the input terminal of the PA 12 and the signal lead 122 increases, the amplification gain in the PA 12 decreases. Also, as the signal transmission loss in the signal bonding wire between the output terminal of the LNA 13 and the signal lead 123 increases, the amplification gain in the LNA 13 decreases.

Therefore, when the RF front end circuit 10 is packaged and installed in a base station, it is important to reduce the transmission loss represented by the S21 parameter in each signal bonding wire. Specifically, for example, when transmitting a signal of 30 GHz, it is desirable to suppress the transmission loss represented by the S21 parameter to be about 0.2 dB in absolute value.

[Structure of Semiconductor Device 100]

Figure 2:
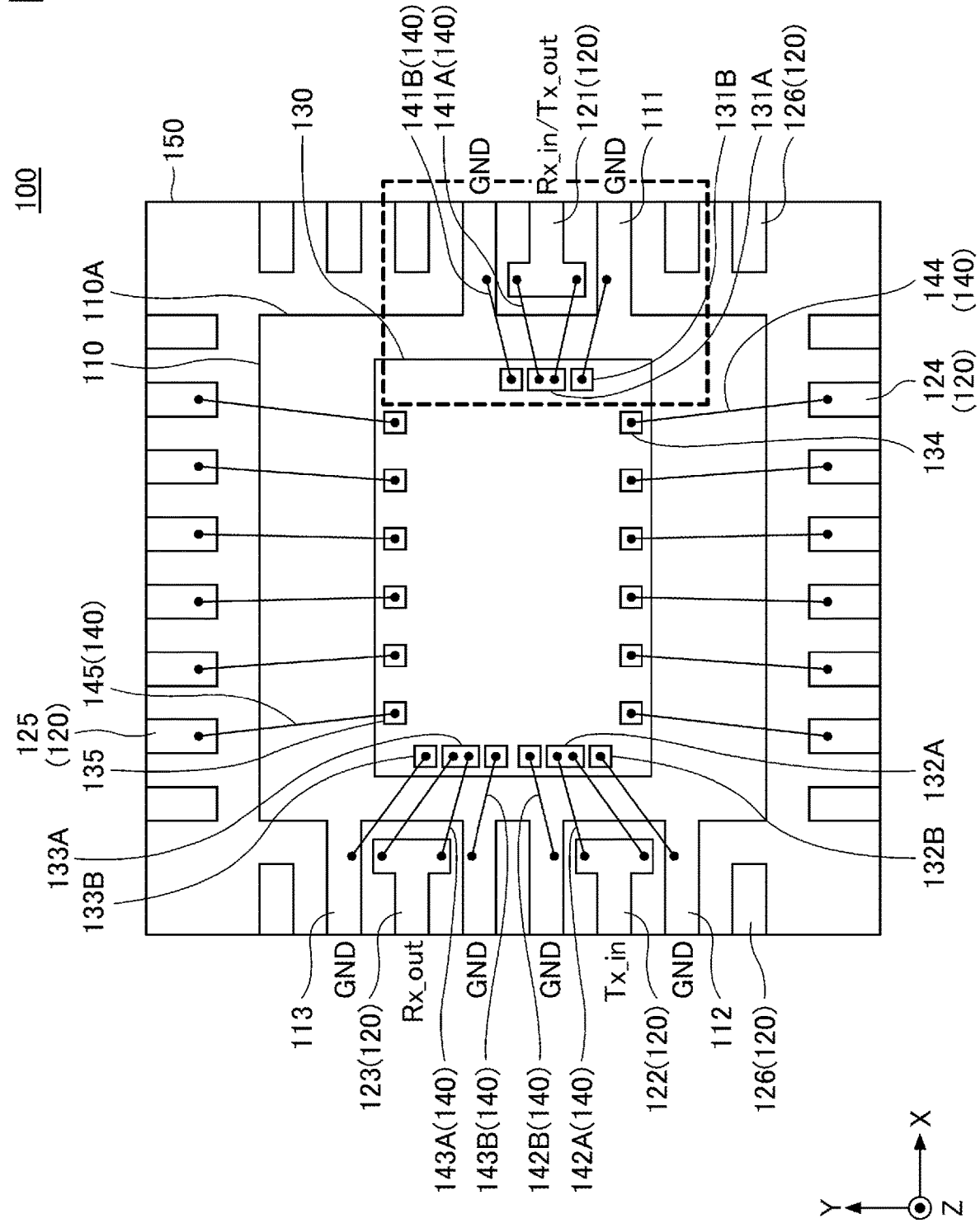
FIG. 2 is a diagram illustrating an example of a configuration of a semiconductor device 100 according to an embodiment.
Figure 3:
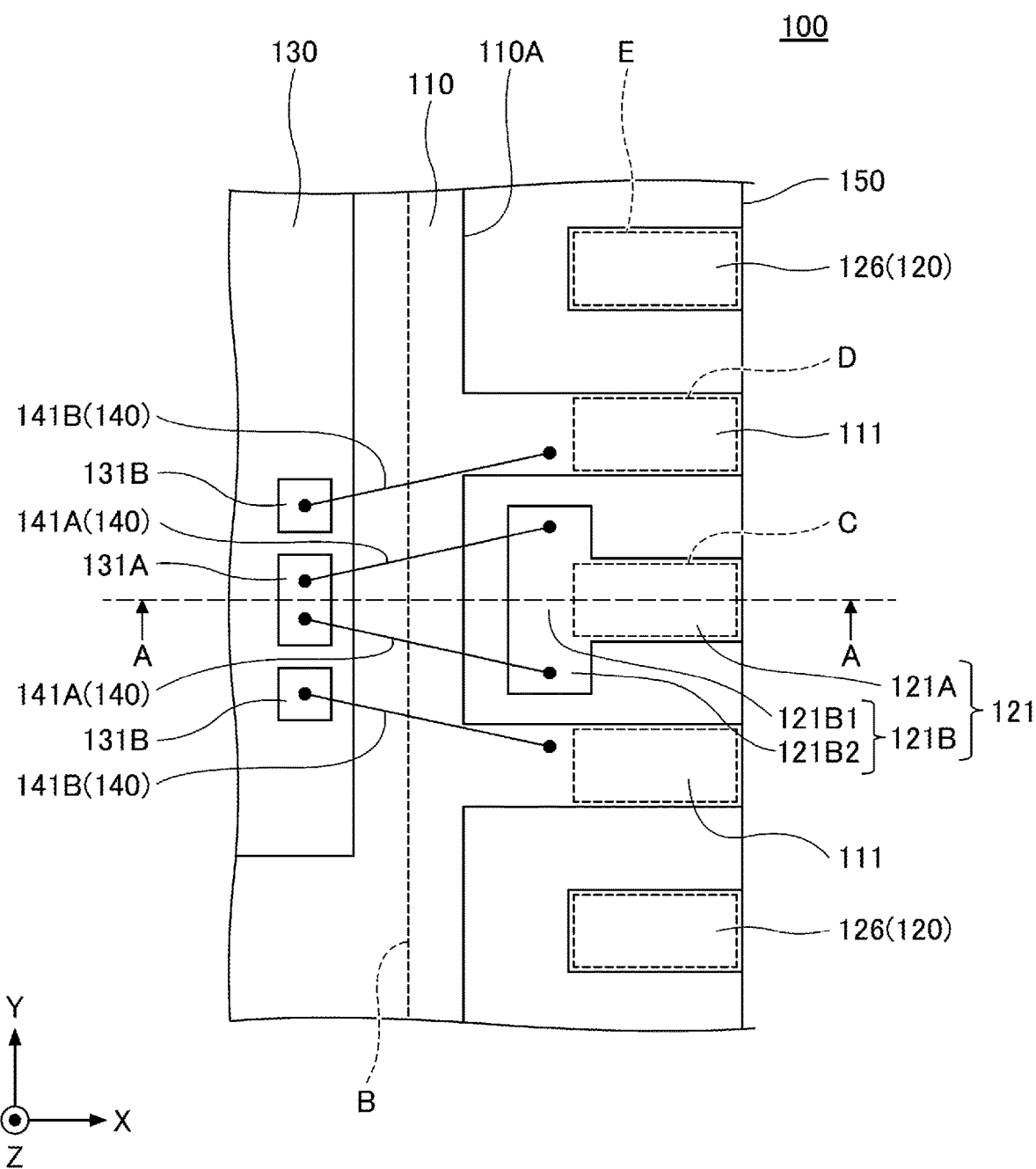
FIG. 3 is an enlarged view illustrating the portion surrounded by the dashed line square in FIG. 2.
Figure 4:
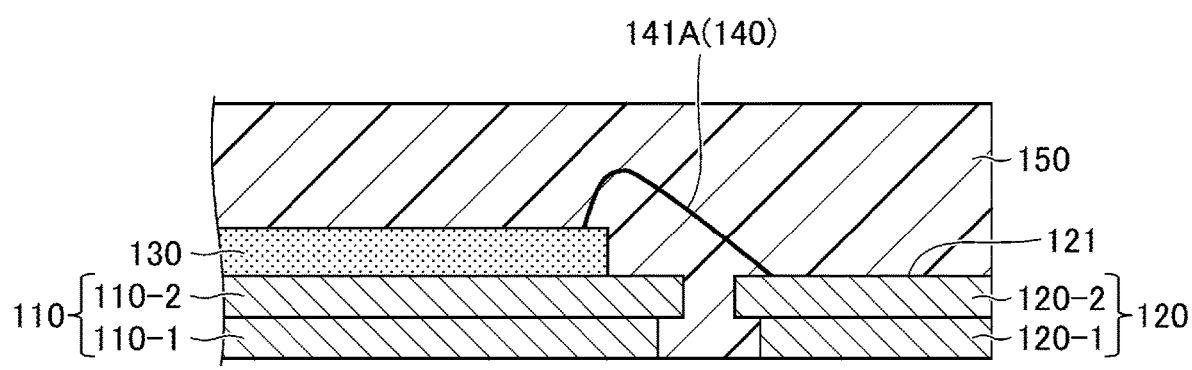
FIG. 4 is a diagram illustrating a cross section taken along the line A-A in FIG. 3.

FIG. 2 is a diagram illustrating an example of a configuration of a semiconductor device 100 according to an embodiment. FIG. 3 is an enlarged view illustrating the portion surrounded by the dashed line square in FIG. 2. FIG. 4 is a diagram illustrating a cross section taken along the line A-A in FIG. 3. In the following, an XYZ coordinate system will be defined and described. Also, in the following, a plan view refers to an XY plane view, and for the sake of description, the −Z direction side is referred to as the lower side, below, or downward, and the +Z direction side is referred to as the upper side, above, or upward, but it does not represent a universal vertical relationship. Also, the Z direction is referred to as the thickness direction.

The semiconductor device 100 includes a die pad 110, a lead 120, an IC (Integrated Circuit) chip 130, bonding wires 140, and a mold resin 150. The semiconductor device 100 has a configuration in which the IC chip 130 is mounted on the upper surface of the die pad 110, the lead 120 arranged around the die pad 110 and the IC chip 130 are connected to each other by the bonding wires 140, and the entirety is sealed and packaged with the mold resin 150. The IC chip 130 is an example of a semiconductor chip and in which the switch circuit 11, the PA 12, and the LNA 13 illustrated in FIG. 1 are incorporated. It should be noted that, in FIG. 2, the die pad 110, the lead 120, the IC chip 130, and the bonding wires 140 covered by the mold resin 150 are transparently illustrated. Also, as an example, the length of the semiconductor device 100 in the X direction and the Y direction may be 2 mm to 10 mm, and the thickness of the semiconductor device 100 may be 0.3 mm to 2 mm.

The die pad 110 is a single metal layer made of a metal or a metal alloy. The die pad 110 is connected to a ground potential point and is held at the ground potential. Here, as an example, the die pad 110 may be made of copper and, for example, may have a thickness between 100 μm and 400 μm. The lower surface of the die pad 110 may be covered by the mold resin 150 or may be exposed. In the present embodiment, the lower surface of the die pad 110 is exposed from the mold resin 150. The die pad 110 is composed of only a single metal layer, the portion exposed from the lower surface of the mold resin 150 is the lower surface of the single metal layer, and the upper surface on which the IC chip 130 is mounted is the upper surface of the single metal layer. The lower surface (−Z direction side surface) of the die pad 110 is an example of a first surface, and the upper surface of the die pad 110 is an example of a second surface. The reason why the die pad 110 is composed of a single metal layer in this way is to make the structure simplified for cost reduction. Also, exposure of a portion of the lower surface of the die pad 110 from the lower surface of the mold resin 150 contributes to enhancing heat dissipation characteristics and electrical characteristics of the semiconductor device 100 while having a structure simplified for cost reduction.

The die pad 110 is prepared from a single metal layer with the lead 120. By applying an etching process to a single metal layer, the die pad 110 and the lead 120 are prepared. As an example, by performing the etching process in two stages, a portion 110-1 and a portion 110-2 having different shapes are formed in the die pad 110 as illustrated in FIG. 4. The die pad 110 has the portion 110-1 and the portion 110-2 and is composed of the portion 110-1 and the portion 110-2. The thicknesses of the portion 110-1 and the portion 110-2 may be 50 μm to 200 μm, for example. It should be noted that the etching process may be either a wet etching process or a dry etching process.

For a single metal layer prior to forming the die pad 110 and the lead 120, by performing a first etching process on a portion with a thickness corresponding to the upper side portion 110-2, and performing a second etching process on a portion with a thickness corresponding to the lower side portion 110-1, the die pad 110 can be prepared. Thus, the lower side portion 110-1 is smaller than the upper side portion 110-2 in plan view. In order to illustrate the shape of the die pad 110 in plan view in FIG. 2 and FIG. 3, the shape of the die pad 110 in FIG. 2 and FIG. 3 is equal to the shape of the upper side portion 110-2. The dashed line B illustrated in FIG. 3 indicates the position of the end edge at the lower side portion 110-1. In FIG. 3, the lower side portion 110-1 is located on the −X direction side relative to the dashed line B. Therefore, in FIG. 4 illustrating the A-A arrow cross-section of FIG. 3, the upper side portion 110-2 protrudes toward the +X direction relative to the lower side portion 110-1.

Although the die pad 110 will be described separately as the portion 110-1 and the portion 110-2 here, the portion 110-1 and the portion 110-2 are a single metal layer, and there is no boundary between the portion 110-1 and the portion 110-2. The portion 110-1 and the portion 110-2 constitute the die pad 110 as a single metal layer.

Such a die pad 110 has a rectangular shape in plan view and has four end edges 110A. Two of the four end edges 110A are parallel to the X axis and the other two end edges are parallel to the Y axis. Also, the die pad 110 has a pair of (two) ground leads 111, a pair of (two) ground leads 112, and a pair of (two) ground leads 113. GND is marked for the ground leads 111, 112, and 113. The pair of ground leads 111 protrude in the +X direction from the +X direction side end edge 110A. The pair of ground leads 112 and the pair of ground leads 113 protrude in the −X direction from the −X direction side end edge 110A. The pair of ground leads 112 are located on the −Y direction side relative to the pair of ground leads 113. It should be noted that end portions of the ground leads 111, 112, and 113 opposite the end portions connected to the end edge 110A are exposed from the side surface of the mold resin 150.

The pairs of ground leads 111, 112, and 113 are respectively connected to pairs of ground pads 131B, 132B and 133B of the IC chip 130 by pairs of ground bonding wires 141B, 142B, and 143B of the bonding wires 140. Therefore, the ground pads 131B, 132B, and 133B are held at the ground potential.

The lead 120 is prepared by performing an etching process in two stages on a single metal layer with the die pad 110. As illustrated in FIG. 4, the lead 120 has a lower side portion 120-1 and an upper side portion 120-2. By performing a first etching process on a portion with a thickness corresponding to the upper side portion 120-2 and performing a second etching process on a portion with a thickness corresponding to the lower side portion 120-1, the lead 120 can be prepared. Thus, the lower side portion 120-1 is smaller than the upper side portion 120-2 in plan view. In order to illustrate the shape of the lead 120 in plan view in FIG. 2 and FIG. 3, the shape of the lead 120 in FIG. 2 and FIG. 3 is equal to the shape of the upper side portion 120-2.

Although the lead 120 will be described separately as the portion 120-1 and the portion 120-2 here, the portion 120-1 and the portion 120-2 are a single metal layer, and there is no boundary between the portion 120-1 and the portion 120-2. The portion 120-1 and the portion 120-2 constitute the lead 120 as a single metal layer. The portion 120-1 is an example of a first portion and the portion 120-2 is an example of a second portion.

The lead 120 has signal leads 121, 122, 123, power leads 124 and 125, and leads 126 as illustrated in FIG. 2. For example, the power leads 124 and 125, and the leads 126 may have a width of 200 μm to 300 μm, and may have a pitch of 400 μm to 600 μm. It should be noted that the pitch of the ground leads 111 and 126 may be equal to the pitch of the power leads 124 and 125 and the leads 126, for example.

Because the signal lead 121 is the lead connected to the antenna 15 as illustrated in FIG. 1, Rx_in/Tx_out is also marked in FIG. 2. The signal lead 121 is provided away from the +X direction side end edge 110A of the die pad 110 and between the pair of ground leads 111 as illustrated in FIG. 2. The signal lead 121 has a shape obtained by rotating a T shape by 90 degrees counterclockwise in plan view. The signal lead 121 is connected to a signal pad 131A of the IC chip 130 by a pair of (two) of signal bonding wires 141A of the bonding wires 140. It should be noted the detailed configuration of the signal lead 121 will be described later with reference to FIG. 2 and FIG. 3.

Because the signal lead 122 is the lead connected to the input terminal of the PA 12 as illustrated in FIG. 1, Tx_in is also marked in FIG. 2. The signal lead 122 is provided away from the −X direction side end edge 110A of the die pad 110 and between the pair of ground leads 112 as illustrated in FIG. 2. The signal lead 122 has a shape obtained by rotating a T shape by 90 degrees clockwise in plan view. The signal lead 122 is connected to a signal pad 132A of the IC chip 130 by the pair of (two) of signal bonding wires 142A of the bonding wires 140. It should be noted that because the detailed configuration of the signal lead 122 is similar to that of the signal lead 121, the description of the detailed configuration of the signal lead 121, which will be described later below, will be incorporated.

Because the signal lead 123 is the lead connected to the output terminal of the LNA 13 as illustrated in FIG. 1, Rx_out is also marked in FIG. 2. The signal lead 123 is provided away from the −X direction side end edge 110A of the die pad 110 and between the pair of ground leads 113 as illustrated in FIG. 2. The signal lead 123 has a shape obtained by rotating the T shape 90 degrees clockwise in plan view. The signal lead 123 is connected to a signal pad 133A of the IC chip 130 by the pair of (two) of signal bonding wires 143A of the bonding wires 140. The signal lead 123 is located on the +Y direction side relative to the signal lead 122. It should be noted that because the detailed configuration of the signal lead 123 is similar to that of the signal leads 121 and 122, the description of the detailed configuration of the signal lead 121, which will be described later below, will be incorporated.

The power leads 124 are six rectangular leads that are away from the −Y direction side end edge 110A of the die pad 110 as illustrated in FIG. 2 and extending in the −Y direction. The six power leads 124 are respectively connected to six power pads 134 of the IC chip 130 by six power bonding wires 144 of the bonding wires 140. The two power leads 124 at voltage Vc1 and voltage Vc2 illustrated in FIG. 1 are two of the six power leads 124 illustrated in FIG. 2. It should be noted that the power leads 124 other than the two power leads 124 at voltage Vc1 and voltage Vc2 of the six power leads 124 may be used as signal leads, not as power leads, for example.

The power leads 125 are six rectangular leads that are away from the +Y direction side end edge 110A of the die pad 110 as illustrated in FIG. 2 and extending in the +Y direction. The six power leads 125 are respectively connected to six power pads 135 of the IC chip 130 by six power bonding wires 145 of the bonding wires 140. The power lead 125 at voltage Vcc illustrated in FIG. 1 is one of the six power leads 125 illustrated in FIG. 2. It should be noted that the power leads 125 other than the power lead 125 at voltage Vcc of the six power leads 125 may be used as signal leads, not as power leads, for example.

The leads 126 are eleven leads that are rectangular in plan view, similar to the power leads 124 and 125. On the +X direction side of the die pad 110, five leads 126 are provided away from the end edge 110A. Two of the five leads 126 are provided on the −Y direction side of the −Y direction side ground lead 111, and the remaining three of the five leads 126 are provided on the +Y direction side of the +Y direction side ground lead 111. On the −X direction side of the die pad 110, away from the end edge 110A, one lead 126 is provided on the −Y direction side of the −Y direction side ground lead 112, and one lead 126 is provided on the +Y direction side of the +Y direction side ground lead 113. On the −Y direction side of the die pad 110, away from the end edge 110A, one lead 126 is provided on each of both sides of the six power leads 124. On the +Y direction side of the die pad 110, away from the end edge 110A, one lead 126 is provided on each of both sides of the six power leads 125. The eleven leads 126 are not connected to bonding wires, for example, but may be connected via bonding wires to a terminal or the like of the IC chip 130.

The IC chip 130 is mounted on the upper surface of the die pad 110. A ground pad located on the lower surface of the IC chip 130 is connected to the die pad 110. Also, the IC chip 130 has the signal pad 131A, the pairs of ground pads 131B, 132B, and 133B, the six power pads 134, and the six power pads 135 on the upper surface.

The bonding wires 140 have the pair (two) of signal bonding wires 141A, the pair (two) of ground bonding wires 141B, the pair (two) of signal bonding wires 142A, the pair (two) ground bonding wires 142B, and the pair (two) of signal bonding wires 143A. Also, the bonding wires 140 have the pair (two) ground bonding wires 143B, the six power bonding wires 144, and the six power bonding wires 145. The connection relationship of each bonding wire 140 is as described above.

The mold resin 150 seals the die pad 110, the lead 120, the IC chip 130, and the bonding wires 140. The mold resin 150 is prepared by molding/shaping using a resin material while holding the die pad 110, the lead 120, the IC chip 130, and the bonding wires 140 arranged and connected as described above in a mold or the like. Thereby, the semiconductor device 100 is packaged. It should be noted that, as a resin material, an epoxy resin or the like may be used, for example. The relative permittivity of such a resin material may be from about 3.0 to about 5.0, for example.

In a state in which the semiconductor device 100 is completed, a portion of the lower surface of the die pad 110 (lower surface of the portion 110-1), the outside end portions of the ground leads 111, 112, and 113 in plan view, a portion of the lower surface of the lead 120 (lower surface of the portion 120-1), and the outside end portion of the lead 120 in plan view are exposed from the mold resin 150.

For the semiconductor device 100, the portion of the lower surface of the die pad 110 (lower surface of the portion 110-1) is used as a terminal (external terminal) for connecting to a ground potential point external to the semiconductor device 100, and the portion of the lower surface of the lead 120 (lower surface of the portion 120-1) is used as a terminal (external terminal) for connecting to a signal terminal, a power terminal, or the like of a device external to the semiconductor device 100. The semiconductor device 100 is a QFN type semiconductor device.

[Detailed Configurations of Signal Lead 121 and Pair of Ground Leads 111]

Next, the detailed configurations of the signal lead 121 and the pair of ground leads 111 will be described, mainly with reference to FIG. 3 and FIG. 4. Here, the detailed configurations of the signal lead 122 and the pair of ground leads 112 and the detailed configurations of the signal lead 123 and the pair of ground leads 113 are similar to the detailed configurations of the signal lead 121 and the pair of ground leads 111, and therefore, the detailed configurations of the signal lead 121 and the pair of ground leads 111 will be described here.

The signal lead 121 has signal lead portions 121A and 121B. The signal lead portion 121A is an example of a first lead portion and the signal lead portion 121B is an example of a second lead portion. The signal lead portion 121A is located farther from the IC chip 130 than the signal lead portion 121B is in plan view and is a root portion of a T shape rotated 90 degrees counterclockwise. The signal lead portion 121B is located closer to the IC chip 130 than the signal lead portion 121A is and extends in the Y direction along the +X direction side end edge 110A. The signal lead portion 121A extends in the +X direction from the center of the signal lead portion 121B in the Y direction.

The signal lead portion 121A is a portion where the portion 120-1 and the portion 120-2 illustrated in FIG. 4 overlap and is present in an area surrounded by the rectangular dashed line C in FIG. 3. FIG. 3 illustrates the dashed line C slightly offset from the contour of the signal lead portion 121A such that the dashed line C can be seen. The +X direction side of the central portion in the Y direction of the signal lead portion 121B is recessed by the −X direction side end portion of the signal lead portion 121A. The lower surface of the signal lead portion 121A present in the dashed line C is exposed as an external terminal from the lower surface of the mold resin 150. It should be noted that such a recess may be omitted, and a T-shaped signal lead 121 may be obtained by combining a rectangular signal lead portion 121A extending in the X direction and a rectangular signal lead extending in the Y direction.

In FIG. 3, the interval between the signal lead portion 121A and the pair of ground leads 111 in the Y direction is equal to the interval between the −Y direction side ground lead 111 and the −Y direction side lead 126 and the interval between the +Y direction side ground lead 111 and the +Y direction side lead 126.

Also, the pair of ground leads 111 are exposed from the lower surface of the mold resin 150 as an external terminal at the areas surrounded by the rectangular dashed lines D. That is, the lower surface at the +X direction side end portion of the pair of ground leads 111 is exposed from the lower surface of the mold resin 150 as an external terminal. FIG. 3 illustrates the dashed lines D slightly offset from the contours of the pair of ground leads 111 such that the dashed lines D can be seen. Also, in FIG. 3, the entire lower surface of the two leads 126, which are located outside the pair of ground leads 111 in the Y direction, is exposed from the lower surface of the mold resin 150 as an external terminal. Thus, the entire illustrated leads 126 are enclosed by the rectangular dashed lines E. The lower surface of the portions enclosed by the dashed lines E (the entire leads 126 in plan view) is exposed from the lower surface of the mold resin 150. It should be noted that such a configuration similarly applies to leads 126 that are not illustrated in FIG. 3. FIG. 3 illustrates the dashed line E slightly offset from the contours of the leads 126 such that the dashed lines E can be seen.

Here, the sizes and the shapes of the areas surrounded by the dashed lines D and E in plan view and their positions in the X direction are equal to the size and the shape of the area surrounded by the dashed line C and its position in the X direction. Accordingly, two external terminals of the pair of ground leads 111, external terminals of the plurality of leads 126, and an external terminal of the signal lead 121 are arranged at an equal interval and at an equal pitch in the Y direction on the lower surface of the mold resin 150. It should be noted that an interval is the interval between end edges closest to each other, and a pitch is the interval between the centers of line widths.

Because the signal lead portion 121B has a wider width than the signal lead portion 121A in the direction of connecting the pair of ground leads 111 (the Y direction), both ends of the signal lead portion 121B in the Y direction are located outside both ends of the signal lead portion 121A in the Y direction. As an example, the width (the width in the Y direction) of the signal lead portion 121A may be 200 μm to 300 μm, and the width (the width in the Y direction) of the signal lead portion 121B may be 450 μm to 700 μm.

In the signal lead portion 121B, a portion having the same width as the width in the Y direction of the signal lead portion 121A in the Y direction is a central portion 121B1. Both end portions of the signal lead portion 121B that are located outside the signal lead portion 121A in the Y direction are end portions 121B2. The two end portions 121B2 are located on respective both end sides of the central portion 121B1 in the Y direction. The +X direction side end portion of the central portion 121B1 is offset toward the −X direction relative to the +X direction side end portions of the two end portions 121B2.

The signal lead 121 is closer to the end edge 110A by the length of the central portion 121B1 as compared to the leads 126. Also, the signal lead portion 121B is closer to the ground leads 111 by the length of the end portions 121B2 compared to the signal lead portion 121A. In other words, both ends of the signal lead portion 121B in the Y direction are closer to the ground leads 111 than both ends of the signal lead portion 121A are in the Y direction. Also, because the +Y direction side end portion 121B2 and the −Y direction side end portion 121B2 are equal in the length in the Y direction, the signal lead 121 has a T shape that is line-symmetric with a straight line, as an axis of symmetry, that is parallel to the X axis passing through the center in the Y direction of the signal lead portion 121A and the signal lead portion 121B in plan view.

Figure 5:
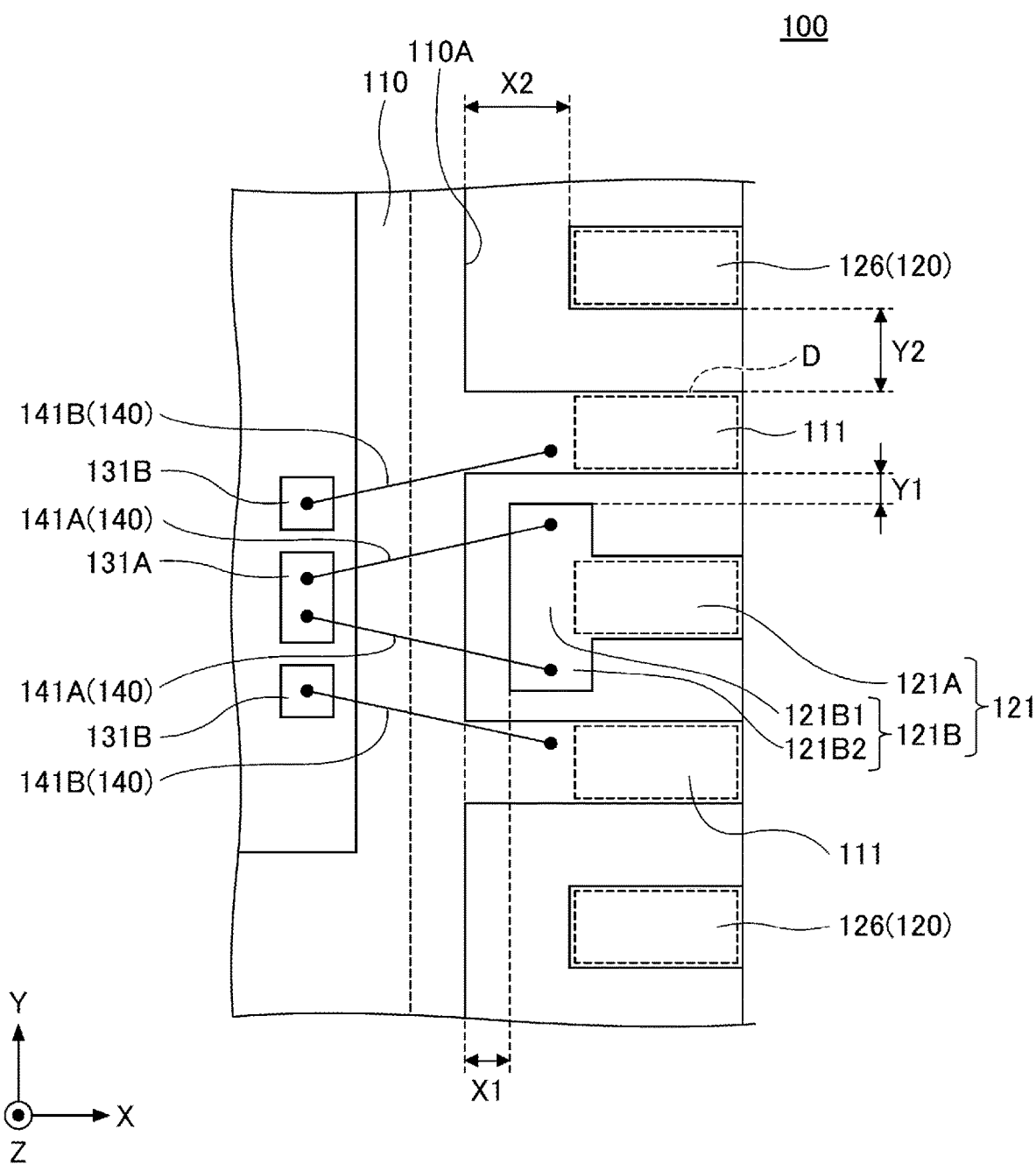
FIG. 5 is a diagram illustrating the intervals between a signal lead 121, a pair of ground leads 111, leads 126, and an end edge 110A.

Here, FIG. 5 is used in addition to FIG. 3 and FIG. 4 in order to describe the positional relationship between the signal lead 121, the pair of ground leads 111, and the leads 126. FIG. 5 is a diagram illustrating the intervals between the signal lead 121, the pair of ground leads 111, the leads 126, and the end edge 110A. FIG. 5 will be described while incorporating the reference numerals of FIG. 3.

As illustrated in FIG. 5, when the interval between the end edge 110A and the signal lead portion 121B is X1 and the interval between the end edge 110A and the leads 126 is X2, X1<X2. That is, the interval X1 between the end edge 110A and the signal lead portion 121B is narrower than the interval X2 between the end edge 110A and the leads 126. This means that the signal lead 121 is closer to the end edge 110A by the length of the signal lead portion 121B as compared to a configuration in which the signal lead 121 does not have the signal lead portion 121B. The die pad 110 has an upper side portion 110-2 protruding along the end edge 110A toward the +X direction, and the signal lead portion 121B has an upper side portion 120-2 of the signal lead 121 protruding toward the −X direction, and thus the interval X1 may be 200 µm or less, for example.

Also, as illustrated in FIG. 5, when the interval between the signal lead portion 121B and the ground leads 111 is Y1 and the interval between the ground leads 111 and the leads 126 is Y2, Y1<Y2. That is, the interval Y1 between the signal lead portion 121B and the ground leads 111 is narrower than the interval Y2 between the ground leads 111 and the leads 126. This means that the signal lead 121 is closer to the ground leads 111 by the length of the signal lead portion 121B compared to a configuration in which the signal lead 121 does not have the signal lead portion 121B.

Also, as illustrated in FIG. 3, the pair of respective signal bonding wires 141A are connected to the +Y direction side end portion 121B2 and the −Y direction side end portion 121B2. The interval between the pair of end portions (the pair of end portions on the +X direction side) of the pair of signal bonding wires 141A connected to the pair of respective end portions 121B2 is greater than interval between the pair of end portions (the pair of end portions on the −X direction side) of the pair of signal bonding wires 141A connected to the signal pad 131A. Thus, the interval between the pair of signal bonding wires 141A in the Y direction increases from the −X direction side to the +X direction side. Here, the pair of end portions (the pair of end portions on the −X direction side) of the pair of signal bonding wires 141A connected to the signal pad 131A is an example of a pair of first end portions. Also, the pair of end portions (the pair of end portions on the +X direction side) of the pair of signal bonding wires 141A connected to the end portions 121B2 of the signal lead portion 121B is an example of a pair of second end portions.

Also, the −Y direction side ground bonding wire 141B connects the −Y direction side ground lead 111 and the −X direction side ground pad 131B. The +Y direction side ground bonding wire 141B connects the +Y direction side ground lead 111 and the +X direction side ground pad 131B. Because the interval between the pair of ground leads 111 is wider than the interval between the pair of ground pads 131B, the interval between the pair of ground bonding wires 141B in the Y direction increases from the −X direction side to the +X direction side, similar to the pair of signal bonding wires 141A. The pair of ground bonding wires 141B extend along the pair of signal bonding wires 141A. In other words, the pair of ground bonding wires 141B extend in parallel with the pair of signal bonding wires 141A. This means that there are two pairs of signal bonding wires 141A and ground bonding wires 141B extending in parallel with each other.

Figure 6:
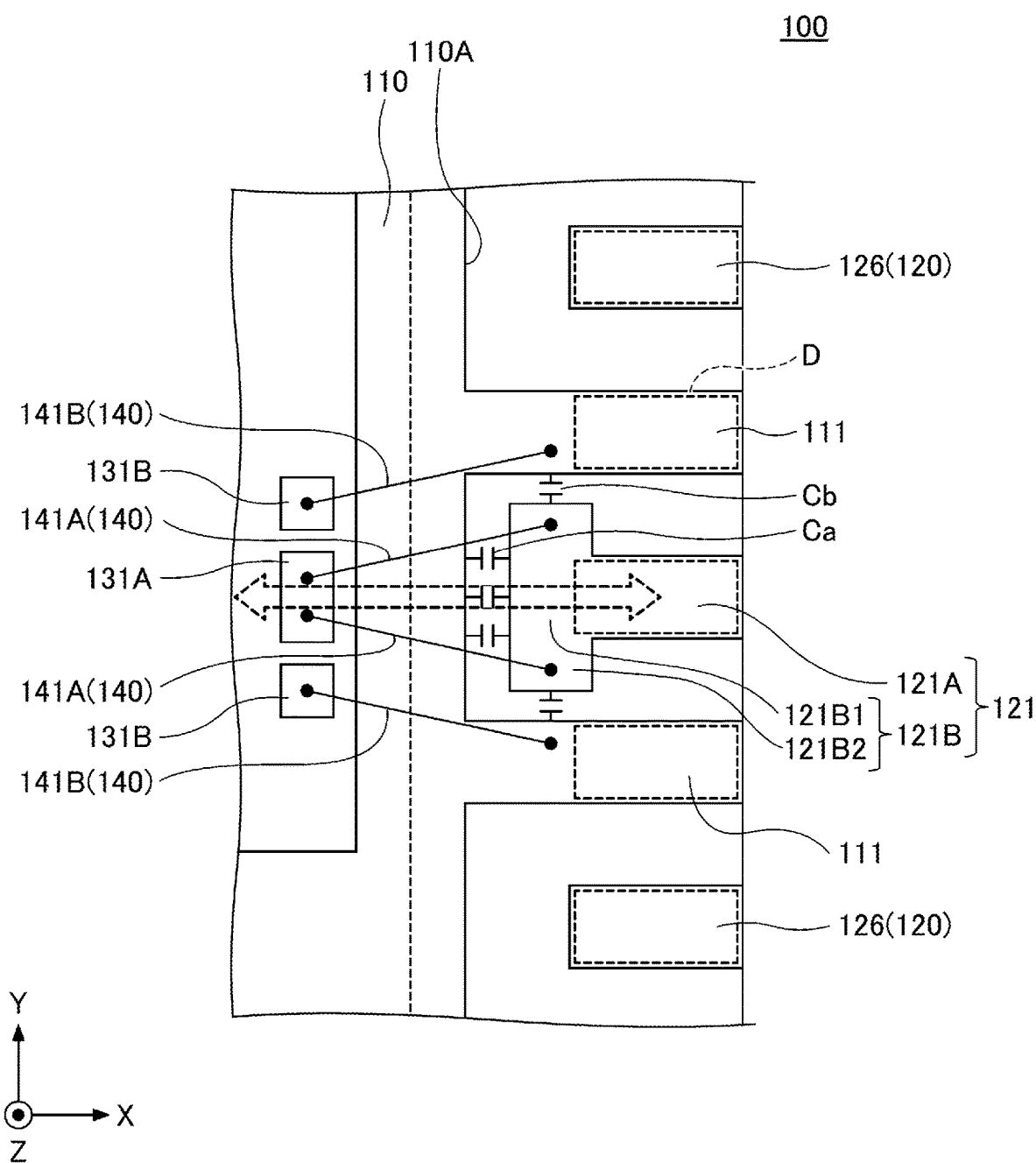
FIG. 6 is a diagram illustrating capacitance generated between the signal lead 121, the pair of ground leads 111, and the die pad 110 and a flowing direction of high-frequency current.

FIG. 6 is a diagram illustrating capacitance generated between the signal lead 121, the pair of ground leads 111, and the die pad 110 and a flowing direction of high-frequency current. Between the signal pad 131A of the IC chip 130 and the signal lead 121, high frequency current flows in the X direction through the signal bonding wires 141A as indicated by the dashed line double arrow. It should be noted that in FIG. 6, only the main reference numerals are illustrated.

Because the signal lead 121 is provided with the signal lead portion 121B to be closer to the end edge 110A and also the die pad 110 has the end edge 110A extending toward the +X direction, the coupling (electrostatic coupling) between the signal lead 121 and the die pad 110 increases and the capacitance Ca (fringe capacitance) occurs as illustrated in FIG. 6. Such capacitance Ca is capacitance that affects the impedance of the signal lead 121 and is so large that it cannot be ignored.

Also, because the signal lead 121 is provided with the signal lead portion 121B protruding outward in the Y direction from the signal lead portion 121A to be closer to the ground leads 111, the coupling (electrostatic coupling) between the signal lead 121 and the ground leads 111 increases and the capacitance (fringe capacitance) Cb occurs as illustrated in FIG. 6. Such capacitance Cb is capacitance that affects the impedance of the signal lead 121 and is so large that it cannot be ignored.

The capacitance Ca between the signal lead 121 and the die pad 110 and the capacitance Cb between the signal lead 121 and the ground leads 111 are along the flowing direction of the high-frequency current and have no spread relative to the flowing direction of the high-frequency current, and thus can be represented by lumped constants in the equivalent circuit. As an example, the thickness of the signal lead 121 and the ground leads 111 may be 100 µm, the width of the signal lead portion 121B in the Y direction may be 700 µm, and the interval between the signal lead 121 and the die pad 110 and the interval (gap) between the signal lead 121 and the ground leads 111 may be 150 µm. In this case, the fringe capacitance that is obtained between the signal lead 121 and the die pad 110 and between the signal lead 121 and the ground leads 111 is 25 fF to 35 fF.

Figure 7:
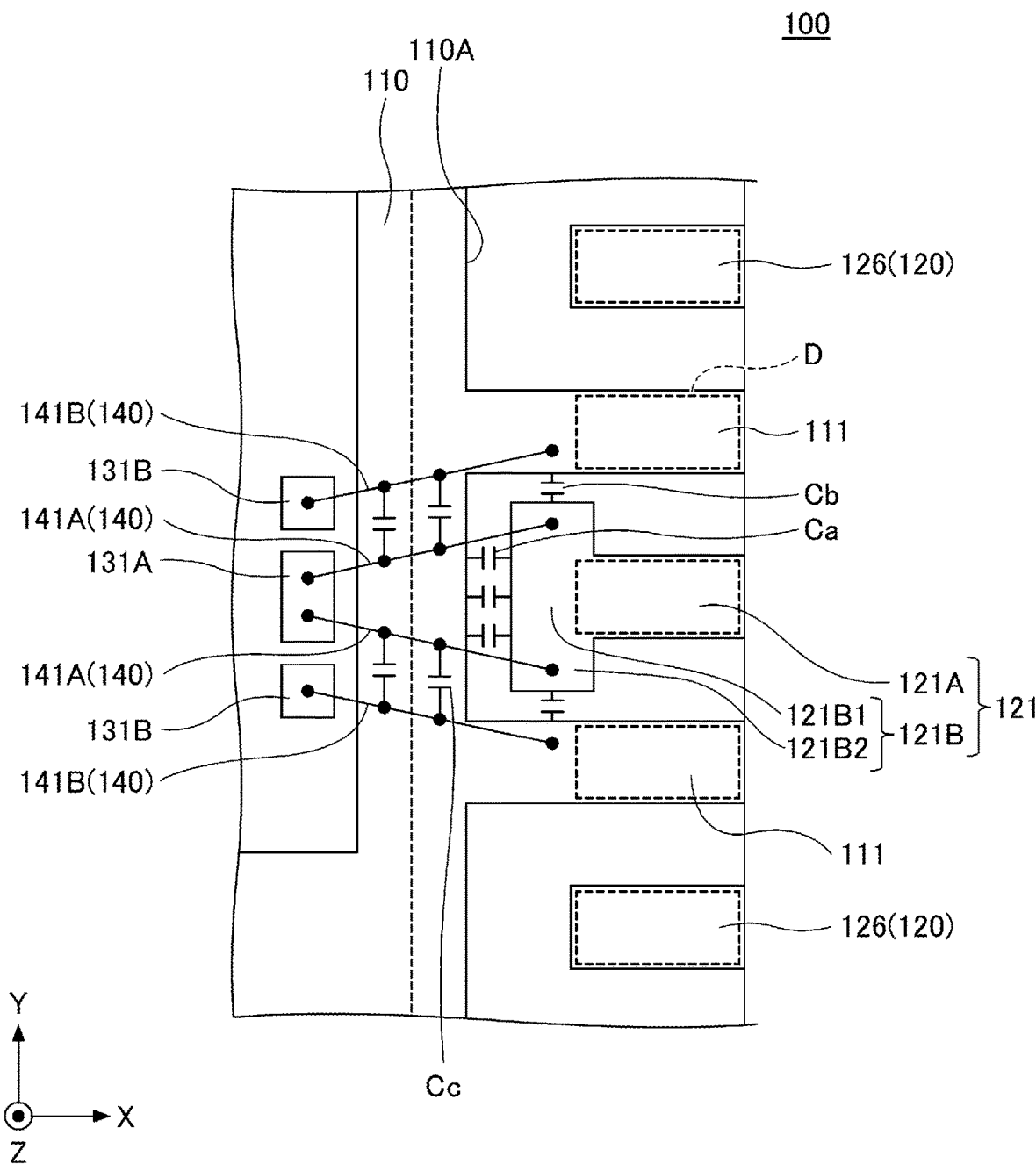
FIG. 7 is a diagram illustrating capacitance that is generated between the signal lead 121, the pair of ground leads 111, and the end edge 110A of the die pad 110 and at signal bonding wires 141A and ground bonding wires 141B.

FIG. 7 is a diagram illustrating the capacitance that is generated between the signal lead 121, the pair of ground leads 111, and the end edge 110A of the die pad 110 and at the signal bonding wires 141A and the ground bonding wires 141B. The capacitance Ca between the signal lead 121 and the die pad 110 and the capacitance Cb between the signal lead 121 and the ground leads 111 are fringe capacitances that can be represented by the lumped constant described above.

Also, the capacitance Cc occurs between the signal bonding wires 141A and the ground bonding wires 141B, as illustrated in FIG. 7. The capacitance Cc is capacitance that is obtained by providing the pair of ground bonding wires 141B to extend along the pair of respective signal bonding wires 141A. Such capacitance Cc affects the impedance of the signal lead 121 and is capacitance that is so large that it cannot be ignored.

[Equivalent Circuit]

Figure 8:
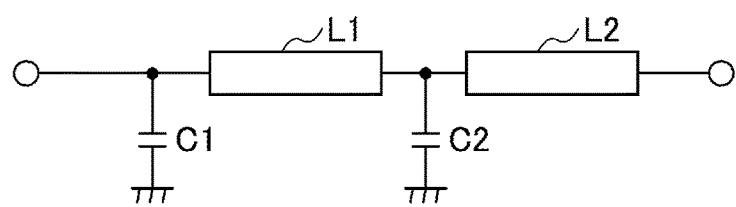
FIG. 8 is a diagram illustrating an equivalent circuit of the signal lead 121, the pair of ground leads 111, the end edge 110A, the signal bonding wires 141A, and the ground bonding wires 141B.

FIG. 8 is a diagram illustrating an equivalent circuit of the signal lead 121, the pair of ground leads 111, the end edge 110A, the signal bonding wires 141A, and the ground bonding wires 141B. In FIG. 8, the left end terminal corresponds to the signal pad 131A and the ground pads 131B of the IC chip 130. The right end terminal corresponds to an external terminal of the signal lead 121 and the pair of ground leads 111.

The capacitor C1 represents the ground capacitance of the die pad 110 as a capacitor. The inductor L1 represents the inductance of the pair of signal bonding wires 141A and the pair of ground bonding wires 141B as an inductor. The capacitor C2 represents the combined capacitance of the fringe capacitance Ca and the fringe capacitance Cb illustrated in FIG. 6 and FIG. 7 as a capacitor. Also, the capacitance Cc between the signal bonding wires 141A and the ground bonding wires 141B provide an effect of reducing the inductance of the inductor L1.

Also, the inductor L2 is an inductor having an inductance of a line that combines a line of an evaluation substrate external to the semiconductor device 100 connected to the signal lead 121 and the pair of ground leads 111 and the signal lead 121 and the pair of ground leads 111. The line of the evaluation substrate has a GSG structure with a signal line sandwiched between a pair of ground lines, similar to the signal lead 121 and the pair of ground leads 111.

In comparison to a semiconductor device for comparison having a GSG structure in which the signal lead portion 121B of the signal lead 121 is not included, the end edge 110A does not protrude toward the +X direction by the upper side portion 110-2, and the number of signal bonding wires 141A is one, the capacitor C2 is added in the semiconductor device 100. Also, by increasing the number of signal bonding wires 141A to two and causing the pair of (two) signal bonding wires 141A and the pair of (two) ground bonding wires 141B to respectively extend in parallel to be coupled, the capacitance of the capacitor C1 is also changed in comparison to the semiconductor device for comparison.

[Capacitance C between Wires]

The capacitance C between the signal bonding wires 141A and the ground bonding wires 141B (capacitance C between the wires) can be approximately expressed by the following formula (1) where the distance between the wires is d and the radii of the wires are r. It should be noted that the radii of the signal bonding wires 141A and the ground bonding wires 141B are equal and both are r.

Formula (1)

$$C = \frac{\pi\varepsilon}{\ln\frac{d-r}{r}} \quad (1)$$

Figure 9:
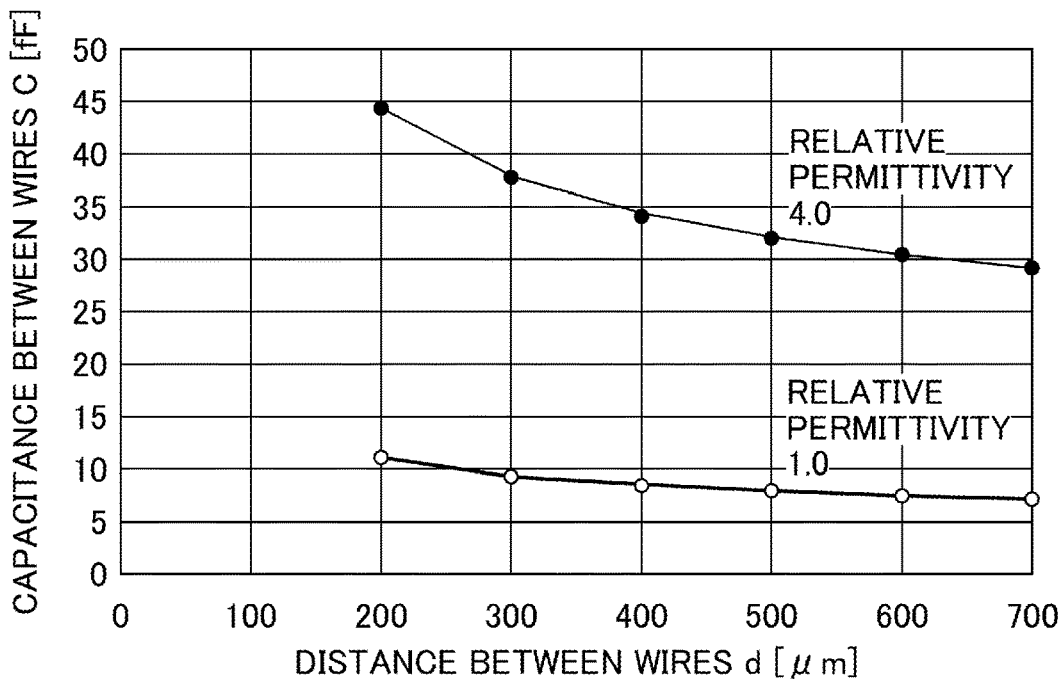
FIG. 9 is a diagram illustrating characteristics of capacitance C between wires with respect to a distance d between the wires.

FIG. 9 is a diagram illustrating the characteristics of the capacitance C between the wires with respect to the distance d between the wires. In FIG. 9, the horizontal axis represents the distance d (μm) between the wires and the vertical axis represents the capacitance C (fF) between the wires. The capacitance C (fF) between the wires represents the capacitance C (fF) per 1 mm of wire. Also, FIG. 9 illustrates the characteristics of a case where the relative permittivity is 1.0 and a case where the relative permittivity 4.0. The relative permittivity of the mold resin 150 is about 4.0.

As illustrated in FIG. 9, it can be seen that in a case in which the relative permittivity is 4.0, the capacitance C between the wires is about three-fold or more of that in a case in which the relative permittivity is 1.0 (without the mold resin 150). Also, when the distance d between the wires becomes 400 (μm) or less at the relative permittivity 4.0, the rate of increase of the capacitance C between the wires increases. In a case in which the distance d between the wires is 300 (μm), the capacitance C is about 37.5 (fF) that is increased by about 20% in comparison to about 32 (fF) in a case in which the distance d between the wires is 500 (μm).

<Characteristic Impedance Z of Wires>

The characteristic impedance Z of the signal bonding wires 141A and the ground bonding wires 141B can be represented by the following formula (2). In the formula (2), C is the capacitance C between the wires and L is the inductance of the signal bonding wires 141A and the ground bonding wires 141B.

Formula (2)

$$Z = \sqrt{\frac{L}{C}} \quad (2)$$

Figure 10:
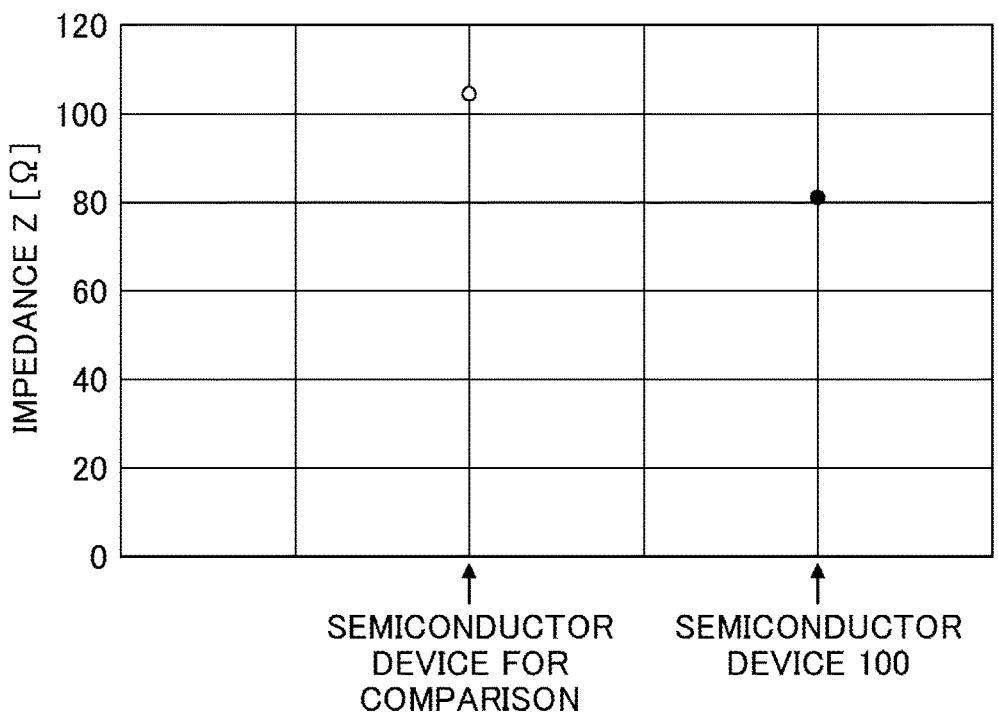
FIG. 10 is a diagram illustrating a calculation result of characteristic impedance Z of the signal bonding wires 141A and the ground bonding wires 141B.

FIG. 10 is a diagram illustrating the calculation result of the characteristic impedance Z of the signal bonding wires 141A and the ground bonding wires 141B. FIG. 10 illustrates the calculation result of the characteristic impedance of the signal bonding wire in the semiconductor device for comparison in addition to the calculation result of the characteristic impedance Z of the signal bonding wires 141A and the ground bonding wires 141B in the semiconductor device 100. The semiconductor device for comparison is a semiconductor device having a GSG structure in which the signal lead portion 121B of the signal lead 121 is not included, the end edge 110A does not protrude toward the +X direction by the upper side portion 110-2, and the number of signal bonding wires 141A is one.

For impedance calculation of the semiconductor device 100, 100, the length of the signal bonding wires 141A and the ground bonding wires 141B were set to be 300 μm, the interval between the wires d and the radii r of the wires r were set to be predetermined values, and the inductance when the pair of signal bonding wires 141A and the pair of ground bonding wires 141B were respectively arranged in parallel was set as 0.5 nH/mm (which is a value when two wires are each arranged in parallel).

Also, for calculation of the semiconductor device for comparison, the signal lead 121 does not have the signal lead portion 121B and the end edge 110A does not protrude toward the +X direction by the upper side portion 110-2, and therefore the length of the signal bonding wire was set to be 500 μm, the radius of the wire was set to be the same value as that of the semiconductor device 100, and the inductance of the single signal bonding wire and the two ground bonding wires was set as 0.7 nH/mm (which is a value when non-parallel three wires are separately present).

As a result, the characteristic impedance Z of the signal bonding wires 141A and the ground bonding wires 141B in the semiconductor device 100 was about 81Ω, and the characteristic impedance Z of the signal bonding wire of the semiconductor device for comparison was about 105Ω. That is, it was found that the characteristic impedance Z of the bonding wires 140 involved in signal transmission can be reduced by about 20% by providing the signal lead portion 121B and by protruding the end edge 110A of the die pad 110 to approach the signal lead 121 to form the fringe capacitance. In other words, it was found that the characteristic impedance of the inductor L1 in the equivalent circuit illustrated in FIG. 8 can be reduced by 20%. It should be noted that although the semiconductor device for comparison has a GSG structure here, when being compared to a conventional semiconductor device having only a signal bonding wire without a ground bonding wire, the reduction in the characteristic impedance becomes even more remarkable.

[Calculation Result of S21 Parameter]

Figure 11:
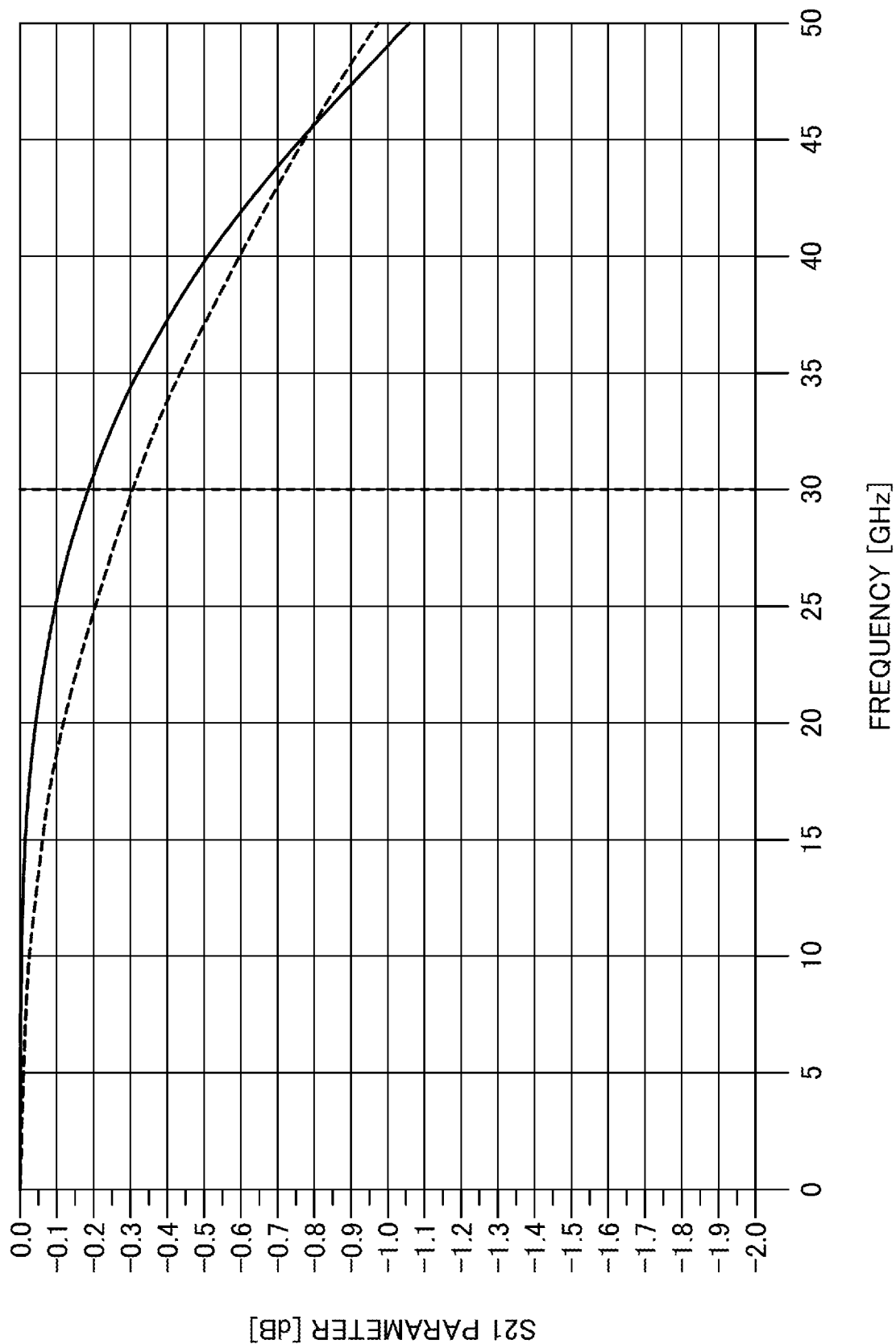
FIG. 11 is a diagram illustrating frequency characteristics of the S21 parameter in the semiconductor device 100.

FIG. 11 is a diagram illustrating frequency characteristics of the S21 parameter in the semiconductor device 100. In FIG. 11, the horizontal axis represents the frequency (GHz) and the vertical axis represents the S21 parameter (dB). The S21 parameter is calculated with a circuit simulator with port 1 as an external terminal of the signal lead 121 and port 2 as the signal pad 131A. That is, the S21 parameter represents the transmission loss of the pair of signal bonding wires 141A.

FIG. 11 illustrates the S21 parameter of the semiconductor device 100 with a solid line in which the signal lead 121 is provided with the signal lead portion 121B and the end edge 110A protrudes toward the +X direction to form the fringe capacitance (see FIG. 6), and the pair of signal bonding wires 141A and the pair of ground bonding wires 141B extend in parallel respectively. In addition, a dashed line indicates the S21 parameter, obtained by excluding the contribution of the fringe capacitance from the component of the S21 parameter indicated by the solid line. The S21 parameter indicated by the dashed line represents the effect obtained by only causing the pair of signal bonding wires 141A and the pair of ground bonding wires 141B to extend respectively in parallel (effect excluding the effect of fringe capacitance), which is not practically feasible, but is illustrated in FIG. 11 because it can be separated with a circuit simulator. In other words, the S21 parameter of the dashed line represents the degree of improvement of the S21 parameter due to the reduction in the characteristic impedance of the pair of signal bonding wires 141A and the pair of ground bonding wires 141B represented as the inductor L1 in the equivalent circuit of FIG. 8.

As illustrated in FIG. 11, at 30 GHz, the S21 parameter of the dashed line was −0.3 dB and the S21 parameter of the solid line was −0.2 dB. Thus, it was found that a small value of −0.3 dB is obtained due to the decrease in the characteristic impedance of the pair of signal bonding wires 141A and the pair of ground bonding wires 141B represented by the inductor L1 in the equivalent circuit of FIG. 8, and further it was found that it is reduced to −0.2 dB by the addition of the fringe capacitance represented as the capacitor C2 in the equivalent circuit of FIG. 8. It should be noted that, in the GSG structure semiconductor device for comparison in which the signal lead portion 121B of the signal lead 121 is not included, the end edge 110A does not protrude by the upper side portion 110-2 toward the +X direction, and the number of signal bonding wires 141A is one, the S21 parameter of the single signal bonding wire 141A was −0.82 dB. Therefore, it was found that the S21 parameter is significantly improved in the semiconductor device 100.

In the embodiment described above, a configuration is adopted in which the signal lead 121 is provided with the signal lead portion 121B, the end edge 110A of the die pad 110 protrudes toward the +X direction, and the pair of signal bonding wires 141A and the pair of ground bonding wires 141B extend in parallel. It was found that such a configuration can reduce the characteristic impedance Z of the bonding wires 140 involved in signal transmission by approximately 20%. This is an effect obtained by being able to shorten the length of the pair of the signal bonding wires 141A and the pair of the ground bonding wires 141B, by providing the signal lead 121 with the signal lead portion 121B and causing the end edge 110A of the die pad 110 to protrude toward the +X direction to bring the signal lead portion 121B and the end edge 110A closer.

Accordingly, a resin sealed semiconductor device 100 with improved impedance characteristics can be provided. Although it is not easy to reduce the characteristic impedance of the bonding wires 140 as compared with the characteristic impedance of the lead 120, the characteristic impedance of the bonding wires 140 involved in signal transmission can be reduced by a configuration described above.

Also, for example, in a case of trying to adjust the characteristic impedance of bonding wires in a ceramic package semiconductor device, there is a high degree of freedom to arrange components for impedance adjustment also in the upper and lower directions of the bonding wires. However, in the case of a resin sealed semiconductor device, such degree of freedom is extremely low because the die pad 110 is a single metal layer. In the resin sealed semiconductor device, because the die pad 110 is a single metal layer, the positions of components for adjusting the characteristic impedance of the bonding wires 140 are limited to a planar direction.

According to the embodiment, under these constraints, the characteristic impedance of the bonding wires 140 is reduced by providing the signal lead 121B on the −X direction side of the signal lead 121 and protruding the end edge 110A of the die pad 110 toward the +X direction to acquire fringe capacitance. Also, by causing the pair of signal bonding wires 141A and the pair of ground bonding wires 141B to extend in parallel to be electrostatically coupled, the characteristic impedance Z of the bonding wires 140 is further reduced. This is as illustrated in FIG. 11.

Although the portions at the signal lead 121 and the ground leads 111 have been described above, the same applies to the portions at the signal lead 122 and the ground leads 112 and the portions at the signal lead 123 and the ground leads 113.

Also, the interval between the signal lead 121 and the die pad 110 is narrower than the interval between the plurality of leads 126 and the die pad 110. When the interval between the signal lead 121 and the die pad 110 is narrow, the capacitance between the signal lead 121 and the die pad 110 is increased. By shortening the signal bonding wires 141A connected to the signal lead 121 and decreasing the inductance, the impedance characteristics of the signal bonding wires 141A connected to the signal lead 121 are further improved. The same applies to the signal leads 122 and 123. Accordingly, a resin sealed semiconductor device 100 with further improved impedance characteristics can be provided.

Also, the die pad 110 further includes the pair of ground leads 111 protruding from the end edge 110A in plan view, the plurality of bonding wires 140 further connect the ground pads 131B of the IC chip 130 and the pair of ground leads 111, and the interval between the signal lead 121 and each of the pair of ground leads 111 is narrower than the interval between the plurality of leads 126. When the interval between the signal lead 121 and each of the pair of ground leads 111 is narrower than the interval between the plurality of leads, the capacitance between the signal lead 121 and each of the pair of ground leads 111 is increased, and by reducing the inductance of the signal bonding wires 141A connected to the signal lead 121, the impedance characteristics of the signal bonding wires 141A connected to the signal lead 121 are further improved. The same applies to the signal leads 122 and 123. Accordingly, a resin sealed semiconductor device 100 with further improved impedance characteristics can be provided.

Also, the signal lead 121 includes the signal lead portion 121A on the side farther from the IC chip 130 in the plan view and the signal lead portion 121B located on the side closer to the IC chip 130 than the signal lead portion 121A is in the plan view, and the signal lead portion 121B has a width wider than the width of the signal lead portion 121A in the direction of connecting the pair of ground leads 111. The interval between the signal lead portion 121B and each of the pair of ground leads 111 is narrower than the interval between the plurality of leads 126. When the signal lead portion 121B, on the closer side to the IC chip 130, of the signal lead 121 has a wider width than that of the signal lead portion 121A on the farther side with respect to the IC chip 130, the capacitance between the signal lead 121 and each of the pair of ground leads 111 can be increased and the capacitance between the signal lead 121 and the die pad 110 can be increased. By such a simple configuration, it is possible to reduce the inductance of the signal bonding wires 141A connected to the signal lead 121 and improve the impedance characteristics of the signal bonding wires 141A connected to the signal lead 121. The same applies to the signal leads 122 and 123. Accordingly, a resin sealed semiconductor device 100 with a simple configuration and with improved impedance characteristics can be provided.

Also, the interval between the signal lead portion 121A and each of the pair of ground leads 111 is equal to the interval between the plurality of leads 126. When the interval between the signal lead portion 121A and each of the pair of ground leads 111 is equal to the interval between the plurality of leads 126, changes from a semiconductor device 100 not having the signal lead portion 121B and the pair of ground leads 111 can be minimized and the configuration is very simple. The same applies to the signal leads 122 and 123. Accordingly, a resin sealed semiconductor device 100 with a simple configuration and with improved impedance characteristics can be provided.

Also, both ends of the signal lead portion 121B in the width direction are located outside both ends of the signal lead portion 121A in the width direction. When both ends of the signal lead portion 121B in the width direction are located outside both ends of the signal lead portion 121A in the width direction, the signal lead portion 121B and the pair of ground leads 111 located on both sides of the signal lead portion 121B in the width direction can be arranged in a balanced manner, the capacitance between the signal lead 121 and each of the pair of ground leads 111 can be efficiently increased, and the capacitance between the signal lead 121 and the die pad 110 can be efficiently increased. As a result, the inductance of the signal bonding wires 141A connected to the signal lead 121 can be efficiently reduced and the impedance characteristics of the signal bonding wires 141A connected to the signal lead 121 can be efficiently improved. The same applies to the signal leads 122 and 123. Accordingly, a resin sealed semiconductor device 100 with further improved impedance characteristics can be provided.

Also, the signal lead portion 121A and the signal lead portion 121B have a line-symmetric shape with respect to an axis of symmetry extending in a direction perpendicular to the end edge 110A in plan view. When the signal lead portion 121A and the signal lead portion 121B are line-symmetric, it is possible to obtain a configuration that enables to easily adjust the capacitance between the signal lead 121 and each of the pair of ground leads 111 and the capacitance between the signal lead 121 and the die pad 110. As a result, the line-symmetric shape can be used to efficiently reduce the inductance of the signal bonding wires 141A connected to the signal lead 121, and the line-symmetric shape can be used to efficiently improve the impedance characteristics of the signal bonding wires 141A connected to the signal lead 121. The same applies to the signal leads 122 and 123. Accordingly, a resin sealed semiconductor device 100 with efficiently improved impedance characteristics using a line-symmetric shape can be provided.

Also, the signal lead portion 121A and the signal lead portion 121B are T-shaped. When the signal lead portion 121A and the signal lead portion 121B are T-shaped, it is possible to obtain a configuration that is easily manufactured and that enables to easily adjust the capacitance between the signal lead 121 and each of the pair of ground leads 111 and the capacitance between the signal lead 121 and the die pad 110. As a result, the inductance of the signal bonding wires 141A connected to the signal lead 121, which enables to easily adjust the capacitance and which is easily manufactured, can be efficiently reduced, and the impedance characteristics of the signal bonding wires 141A connected to the signal lead 121, which enables to easily adjust the capacitance and which is easily manufactured, can be efficiently improved. The same applies to the signal leads 122 and 123. Accordingly, a resin sealed semiconductor device 100 that enables to easily adjust the capacitance, that is easily manufactured, and that has efficiently improved impedance characteristics can be provided.

Also, the pair of signal bonding wires 141A of the plurality of bonding wires 140 connecting the signal lead portion 121B of the signal lead 121 and the signal pad 131A are connected to respective portions of the signal lead portion 121B located on both sides in the width direction and outside the signal lead portion 121A. When the pair of signal bonding wires 141A connecting the signal lead portion 121B of the signal lead 121 and the signal pad 131A are connected to respective portions of the signal lead portion 121B located on both sides in the width direction and outside the signal lead portion 121A, because the pair of signal bonding wires 141A can be brought closer to the pair of ground leads 111, the inductance of the pair of signal bonding wires 141A can be effectively reduced, and the impedance characteristics of the pair of signal bonding wires 141A can be effectively improved. The same applies to the signal leads 122 and 123. Accordingly, a resin sealed semiconductor device 100 with effectively improved impedance of the pair of signal bonding wires 141A can be provided.

Also, the interval between the end portions at which the pair of signal bonding wires 141A are connected to the signal lead portion 121B is wider than the interval between the end portions at which the pair of signal bonding wires 141A are connected to the signal pad 131A. Because the pair of signal bonding wires 141A can be reliably brought closer to the pair of ground leads 111, the inductance of the pair of signal bonding wires 141A can be more reliably reduced and the impedance characteristics of the pair of signal bonding wires 141A can be improved more reliably. The same applies to the signal leads 122 and 123. Accordingly, a resin sealed semiconductor device 100 with further reliably improved impedance of the pair of signal bonding wires 141A can be provided.

Also, the pair of ground bonding wires 141B connecting the pair of ground leads 111 and the ground pads 131B of the plurality of bonding wires 140 extend along the pair of signal bonding wires 141A. Using the capacitance by the coupling of the pair of ground bonding wires 141B and the pair of signal bonding wires 141A, the inductance of the pair of signal bonding wires 141A can be more effectively reduced and the impedance characteristics of the pair of signal bonding wires 141A can be more effectively improved. The same applies to the ground bonding wires 142B and 143B. Accordingly, a resin sealed semiconductor device 100 with further effectively improved impedance of the pair of signal bonding wires 141A can be provided.

Also, the signal lead 121 includes the portion 120-1 that is located on the lower surface side and the portion 120-2 that is in continuous with the portion 120-1 and that is located on the upper surface side, wherein the signal lead portion 121A extends at the portion 120-1 and the portion 120-2, and the signal lead portion 121B extends only at the portion 120-2. For the signal lead portion 121A of the signal lead 121, changes from a semiconductor device 100 without the signal lead portion 121B and the pair of ground leads 111 can be minimized and the signal lead portion 121B can be realized only with the portion 120-2, and therefore the configuration is very simple. The same applies to the signal leads 122 and 123. Accordingly, a resin sealed semiconductor device 100 with a very simple configuration and with improved impedance characteristics can be provided.

Also, because the mold resin 150 exposes at least a portion of the lower surface of the pair of ground leads 111 and at least a portion of the lower surface of the signal leads 121, 122, and 123, a QFN-type semiconductor device can be realized. For example, at least a portion of the lower surface of the signal lead 121 may be the signal lead portion 121A, and the same applies to the signal leads 122 and 123. Accordingly, the lower side surface of the signal leads 121, 122, and 123 can be utilized as an external terminal, and a QFN-type semiconductor device 100 with improved impedance characteristics can be provided.

It should be noted that in the embodiment described above, the semiconductor device 100 acquires the fringe capacitance by providing the signal lead 121 with the signal lead portion 121B and by extending the end side 110A of the die pad 110 toward the +X direction. That is, in the embodiment described above, the fringe capacitance is acquired by narrowing the interval between the signal lead 121 and the die pad 110 in the X direction and by narrowing the interval between the signal lead portion 121B of the signal lead 121 and the ground leads 111 in the Y direction. However, without including both narrowing the interval between the signal lead 121 and the die pad 110 in the X direction and narrowing the interval between the signal lead portion 121B of the signal lead 121 and the ground leads 111 in the Y direction, by the fringe capacitance obtained by including at least one of these, the characteristic impedance of the bonding wires 140 involved in signal transmission may be reduced.

Also, in the embodiment described above, the signal lead 121 has the signal lead portion 121A and the signal lead portion 121B extending outward in the Y direction from the signal lead portion 121A. However, the signal lead 121 is not limited to such a configuration but may be a configuration that can realize at least one of narrowing the interval between the signal lead 121 and the die pad 110 in the X direction and narrowing the interval between the signal lead portion 121B of the signal lead 121 and the ground leads 111 in the Y direction. For example, the signal lead 121 may be a thick lead having the same width as the width of the signal lead portion 121B in the Y axis direction from the −X direction side end portion to the +X direction side end portion.

Thus, the signal lead portion 121A and the signal lead portion 121B of the signal lead 121 may not be T-shaped and may not be line-symmetric with a straight line, as an axis of symmetry, that is parallel to the X axis passing through the center in the Y direction of the signal lead portion 121A and the signal lead portion 121B.

Also, the interval between the signal lead portion 121A and the ground leads 111 in the Y direction may not be equal to the interval between adjacent leads 126 and may be different from the interval between adjacent power leads 124 or the interval between adjacent power leads 125.

Also, the portions where the signal bonding wires 141A are connected to the signal lead 121 may be the central portion 121B1 rather than the end portions 121B2 located outside the central portion 121B1 of the signal lead portion 121B.

Also, the interval where the pair of signal bonding wires 141A are connected to the signal lead 121 in the Y axis direction may not be wider than the interval where the pair of signal bonding wires 141A are connected to the signal pad 131A in the Y axis direction. Also, the pair of ground bonding wires 141B may not be along (may not be in parallel with) the pair of respective signal bonding wires 141A.

Also, the position, the size, and the shape of an external terminal that is realized by the exposure of the lower surface of the die pad 110 or the lead 120 from the mold resin 150 may be modified as appropriate, and not limited to those described above. Also, the die pad 110 may not have a configuration of including the portion 110-1 and the portion 110-2 formed by two-stage etching, and the lead 120 may not have a configuration of including the portion 120-1 and the portion 120-2 formed by two-stage etching.

The semiconductor device 100 may also be modified as illustrated in FIG. 12. FIG. 12 is a diagram illustrating a semiconductor device 100A according to a modified example of the embodiment. The semiconductor device 100A has a configuration in which between the pairs of signal bonding wires 141A, 142A, and 143A illustrated in FIG. 2, and other signal bonding wires 141A, 142A, and 143A are respectively added. In this manner, the electrostatic coupling between the plurality of signal bonding wires 141A, 142A, and 143A becomes further stronger, and the S21 parameters of the signal bonding wires 141A, 142A, and 143A can be further reduced. As a result, the impedance of the signal bonding wires 141A, 142A, and 143A can be further reduced.

Although the semiconductor devices of the exemplary embodiment of the present invention have been described above, the present invention is not limited to the specifically disclosed embodiments, and various modifications and changes can be made without departing from the scope of claims.

What is claimed is:

1. A semiconductor device comprising:
a single die pad having a first surface, a second surface that is an opposite side of the first surface, and a pair of ground leads protruding from an end edge in plan view, the die pad being made of a metal or a metal alloy;
a signal lead that is arranged between the pair of ground leads;
a plurality of leads that are arranged around the die pad in plan view;
a semiconductor chip that is mounted on the second surface;
a plurality of bonding wires connecting a signal pad of the semiconductor chip and the signal lead and connecting a ground pad of the semiconductor chip and the pair of ground leads; and
a mold resin covering the die pad, the signal lead, the plurality of leads, the semiconductor chip, and the plurality of bonding wires;
wherein an interval between the signal lead and each of the pair of ground leads is narrower than an interval between the plurality of leads.

2. The semiconductor device according to claim 1, wherein an interval between the signal lead and the die pad is narrower than an interval between the plurality of leads and the die pad.

3. A semiconductor device according comprising:
a single die pad having a first surface and a second surface that is an opposite side of the first surface, the die pad being made of a metal or a metal alloy;
a signal lead that is arranged next to the die pad in plan view;
a plurality of leads that are arranged around the die pad in plan view;
a semiconductor chip that is mounted on the second surface;
a plurality of bonding wires connecting a signal pad of the semiconductor chip and the signal lead and connecting the semiconductor chip and at least one of the plurality of leads; and
a mold resin covering the die pad, the signal lead, the plurality of leads, the semiconductor chip, and the plurality of bonding wires;
wherein an interval between the signal lead and the die pad is narrower than an interval between the plurality of leads and the die pad.

4. The semiconductor device according to claim 3,
wherein the die pad further includes a pair of ground leads protruding from an end edge in plan view,
wherein the plurality of bonding wires further connect a ground pad of the semiconductor chip and the pair of ground leads, and
wherein an interval between the signal lead and each of the pair of ground leads is narrower than an interval between the plurality of leads.

5. The semiconductor device according to claim 1, wherein the signal lead includes
a first lead portion on a far side from the semiconductor chip in plan view; and
a second lead portion located on a closer side to the semiconductor chip than the first lead portion is in plan view and having a width wider than a width of the first lead portion in a direction of connecting the pair of ground leads, and
wherein an interval between the second lead portion and each of the pair of ground leads is narrower than the interval between the plurality of leads.

6. The semiconductor device according to claim 5, wherein an interval between the first lead portion and each of the pair of ground leads is equal to the interval between the plurality of leads.

7. The semiconductor device according to claim 5, wherein both ends of the second lead portion in the width direction are located outside both ends of the first lead portion in the width direction.

8. The semiconductor device according to claim 5, wherein the first lead portion and the second lead portion have a line-symmetric shape with respect to an axis of symmetry extending in a direction perpendicular to the end edge in plan view.

9. The semiconductor device according to claim 5, wherein the first lead portion and the second lead portion are T-shaped.

10. The semiconductor device according to claim 5, wherein a pair of signal bonding wires of the plurality of bonding wires connecting the second lead portion of the signal lead and the signal pad are connected to respective portions of the second lead portion located on both sides in the width direction and outside the first lead portion.

11. The semiconductor device according to claim 10, wherein an interval between second end portions at which the pair of signal bonding wires are connected to the second lead portion is wider than an interval between first end portions at which the pair of signal bonding wires are connected to the signal pad.

12. The semiconductor device according to claim 10, wherein a pair of ground bonding wires of the plurality of bonding wires connecting the pair of ground leads and the ground pad extend along the pair of signal bonding wires.

13. The semiconductor device according to claim 5,
wherein the signal lead includes a first portion that is located on the first surface side and a second portion that is in continuous with the first portion and that is located on the second surface side,
wherein the first lead portion extends at the first portion and the second portion, and
wherein the second lead portion extends only at the second portion.

14. The semiconductor device according to claim 1, wherein the mold resin exposes at least a portion of the first surface and at least a portion of the signal lead on the first surface side.

* * * * *